United States Patent
Kawaguchi et al.

(10) Patent No.: US 7,655,869 B2
(45) Date of Patent: *__Feb. 2, 2010__

(54) FLEX-RIGID WIRING BOARD

(75) Inventors: Katsuo Kawaguchi, Gifu (JP);
Hirofumi Futamura, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/965,384

(22) Filed: Dec. 27, 2007

(65) Prior Publication Data

US 2008/0105456 A1    May 8, 2008

Related U.S. Application Data

(62) Division of application No. 10/546,298, filed as application No. PCT/JP2004/005460 on Apr. 16, 2004, now Pat. No. 7,378,596.

(30) Foreign Application Priority Data

Apr. 18, 2003   (JP) .............................. 2003-113549

(51) Int. Cl.
   *H05K 1/00*    (2006.01)
(52) U.S. Cl. ...................................... 174/254
(58) Field of Classification Search ................. 174/254, 174/255
   See application file for complete search history.

(56) References Cited

U.S. PATENT DOCUMENTS

| | | |
|---|---|---|
| 4,716,259 A | 12/1987 | Tokura et al. |
| 4,954,480 A | 9/1990 | Imanaka et al. |
| 4,958,050 A | 9/1990 | Oku et al. |
| 5,084,961 A | 2/1992 | Yoshikawa |
| 5,183,969 A | 2/1993 | Odashima |
| 5,427,641 A | 6/1995 | Muramatsu et al. |
| 5,428,190 A | 6/1995 | Stopperan |
| 5,600,103 A * | 2/1997 | Odaira et al. ............... 174/265 |
| 5,612,840 A | 3/1997 | Hiraoka et al. |
| 5,838,519 A | 11/1998 | Takizawa et al. |
| 5,886,858 A | 3/1999 | Yanagihara |

(Continued)

FOREIGN PATENT DOCUMENTS

CN        88102545 A      11/1988

(Continued)

OTHER PUBLICATIONS

U.S. Appl. No. 11/629,099, filed Dec. 11, 2006, Mikado et al.

*Primary Examiner*—Dean A. Reichard
*Assistant Examiner*—Abiy Getachew
(74) *Attorney, Agent, or Firm*—Oblon, Spivak, McClelland, Maier & Neustadt, L.L.P.

(57) ABSTRACT

A flex-rigid wiring board has an insulative adhesive interposed between portions, lapping over each other, of the rigid and flexible substrates; and the interconnecting electrode pads on the rigid and flexible substrates are electrically connected to each other through a conductor lump penetrating the insulative adhesive, thereby providing lowered inductance in the high-frequency band, shortened signal-delay time, reduced noise generation due to signal reflected-wave, reduced drop impact, high connection reliability and high freedom of wire connection, and the wiring board can advantageously be manufactured with a reduced cost and a high yield.

10 Claims, 21 Drawing Sheets

U.S. PATENT DOCUMENTS

| | | | |
|---|---|---|---|
| 6,091,475 A | 7/2000 | Ogino et al. | |
| 6,326,555 B1 * | 12/2001 | McCormack et al. | 174/255 |
| 6,329,610 B1 * | 12/2001 | Takubo et al. | 174/264 |
| 6,350,365 B1 * | 2/2002 | Koyama et al. | 205/125 |
| 6,395,993 B1 | 5/2002 | Nakamura et al. | |
| 6,449,836 B1 | 9/2002 | Miyake et al. | |
| 6,570,098 B2 | 5/2003 | Shimizu et al. | |
| 6,703,566 B1 * | 3/2004 | Shiraishi et al. | 174/260 |
| 6,713,682 B1 | 3/2004 | Hirahara et al. | |
| 6,759,600 B2 | 7/2004 | Koyama et al. | |
| 6,774,968 B2 | 8/2004 | Hagiwara | |
| 6,859,053 B1 | 2/2005 | Sato et al. | |
| 6,888,606 B2 | 5/2005 | Hinata et al. | |
| 6,911,605 B2 | 6/2005 | Okada et al. | |
| 6,981,317 B1 | 1/2006 | Nishida | |
| 7,088,417 B2 | 8/2006 | Kamijima et al. | |
| 7,378,596 B2 * | 5/2008 | Kawaguchi et al. | 174/255 |
| 2003/0111742 A1 | 6/2003 | Iwasaki et al. | |
| 2003/0222260 A1 | 12/2003 | Tone et al. | |
| 2004/0174487 A1 | 9/2004 | Yamazaki et al. | |
| 2005/0161250 A1 | 7/2005 | Hiramoto | |
| 2006/0169485 A1 | 8/2006 | Kawaguchi et al. | |
| 2007/0012475 A1 | 1/2007 | Kawaguchi et al. | |

FOREIGN PATENT DOCUMENTS

| | | |
|---|---|---|
| CN | 1287285 A | 3/2001 |
| CN | 1325262 A | 12/2001 |
| CN | 1426858 A | 7/2003 |
| EP | 0823833 | 2/1998 |
| GB | 2 294 363 | 4/1996 |
| JP | 59-3567 | 1/1984 |
| JP | 59-145058 | 9/1984 |
| JP | 60-124056 | 8/1985 |
| JP | 3-109368 | 11/1991 |
| JP | 5-90756 | 4/1993 |
| JP | 5-41171 | 6/1993 |
| JP | 6-45364 | 6/1994 |
| JP | 6-314862 | 11/1994 |
| JP | 7-38222 | 2/1995 |
| JP | 7-106728 | 4/1995 |
| JP | 7-170076 | 7/1995 |
| JP | 7-183663 | 7/1995 |
| JP | 8-125342 | 5/1996 |
| JP | 8-335759 | 12/1996 |
| JP | 10-200256 | 7/1998 |
| JP | 10-256688 | 9/1998 |
| JP | 11-054927 | 2/1999 |
| JP | 2000-133944 | 5/2000 |
| JP | 2001-77501 | 3/2001 |
| JP | 2001-102734 | 4/2001 |
| JP | 2001-251053 | 9/2001 |
| JP | 2001-267695 | 9/2001 |
| JP | 2001-284747 | 10/2001 |
| JP | 2001-339126 | 12/2001 |
| JP | 2002-064271 | 2/2002 |
| JP | 2003-110240 | 4/2003 |
| JP | 2003-200236 | 7/2003 |
| JP | 2003-238709 | 8/2003 |
| JP | 2004-63908 | 2/2004 |
| WO | WO 2005/122656 A1 | 12/2005 |

* cited by examiner

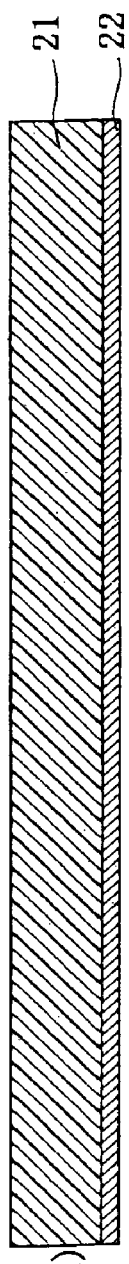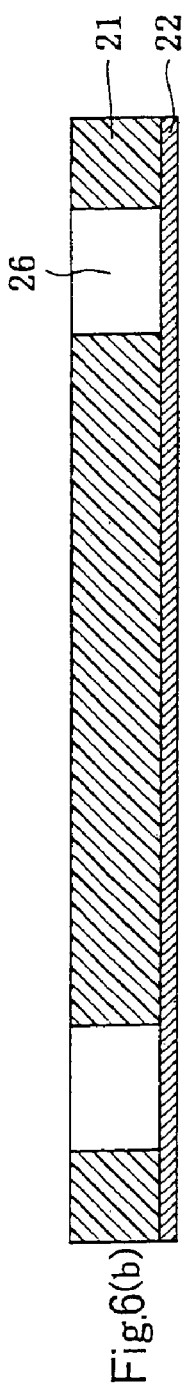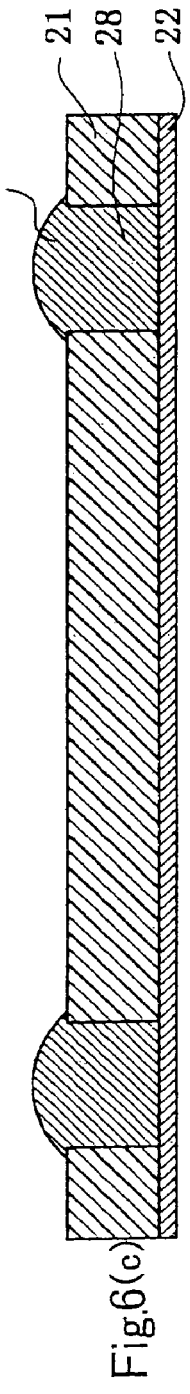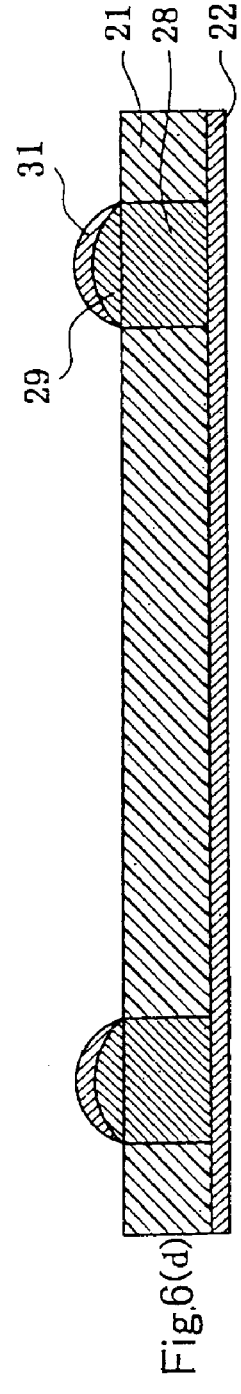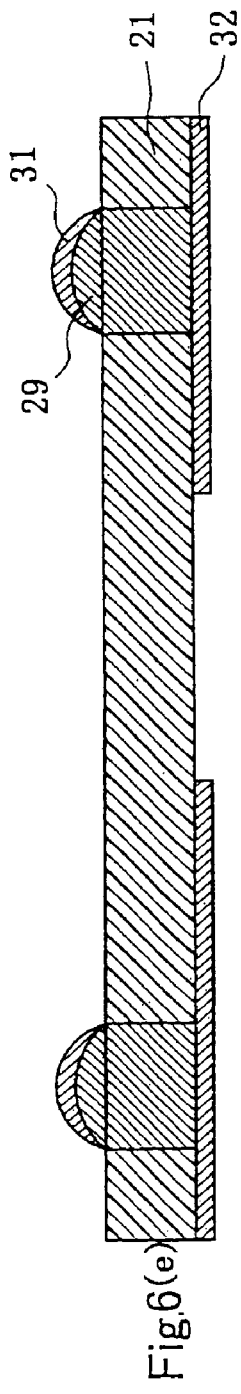

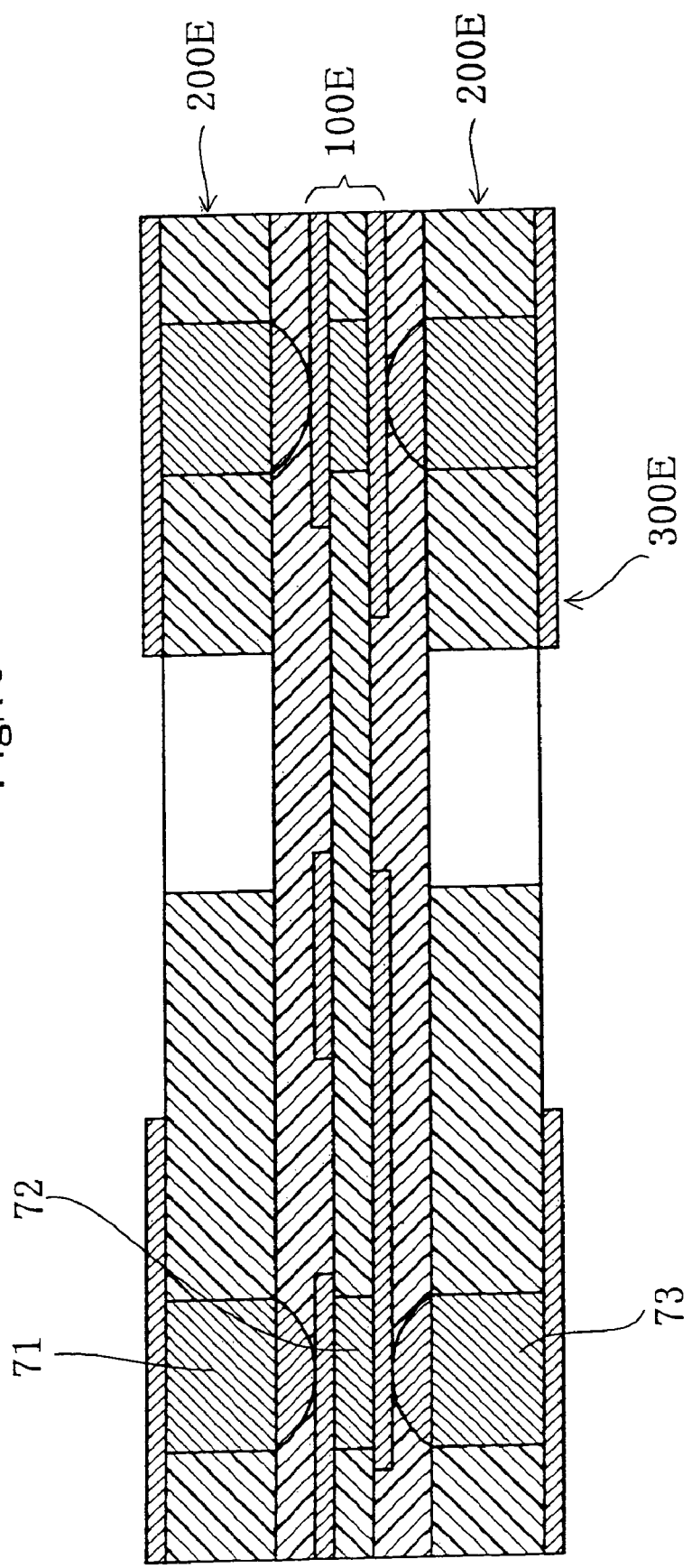

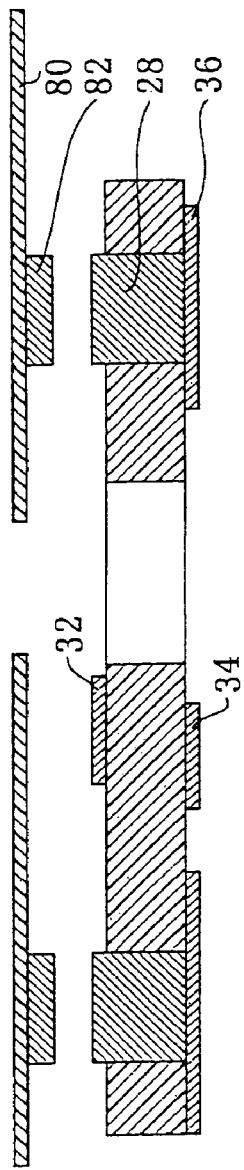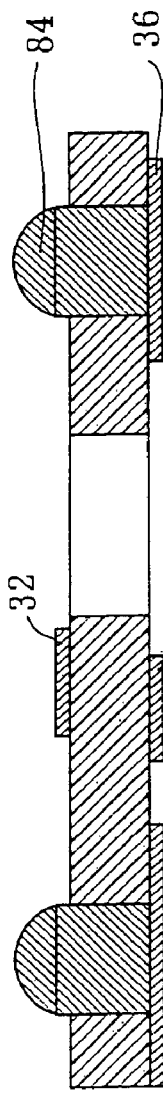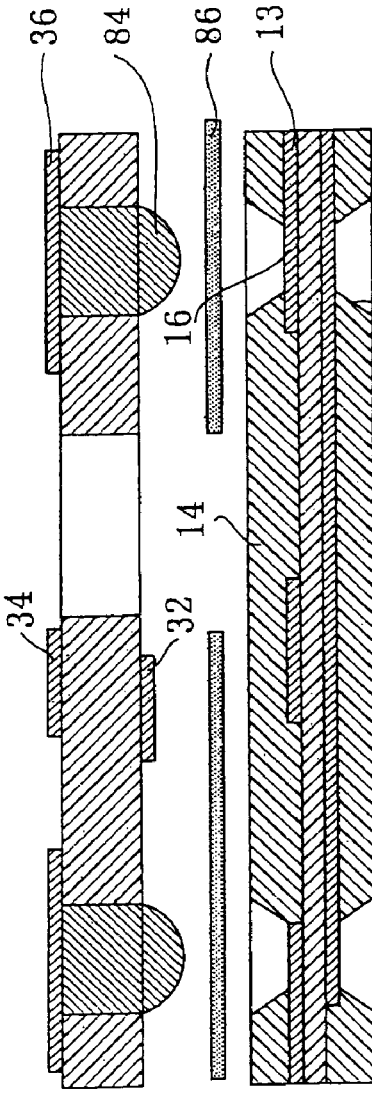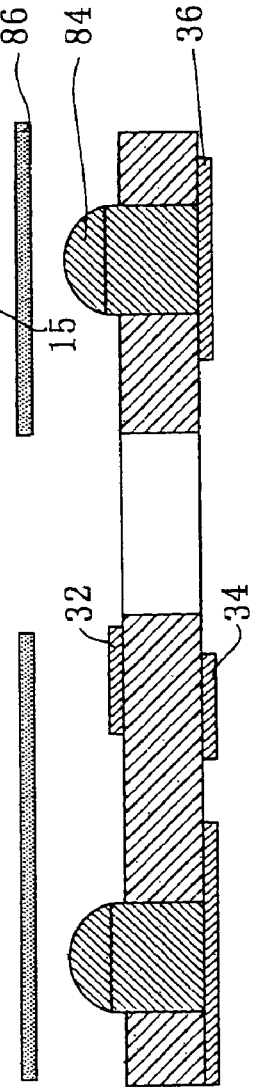
Fig.11(a) Fig.11(b) Fig.11(c)

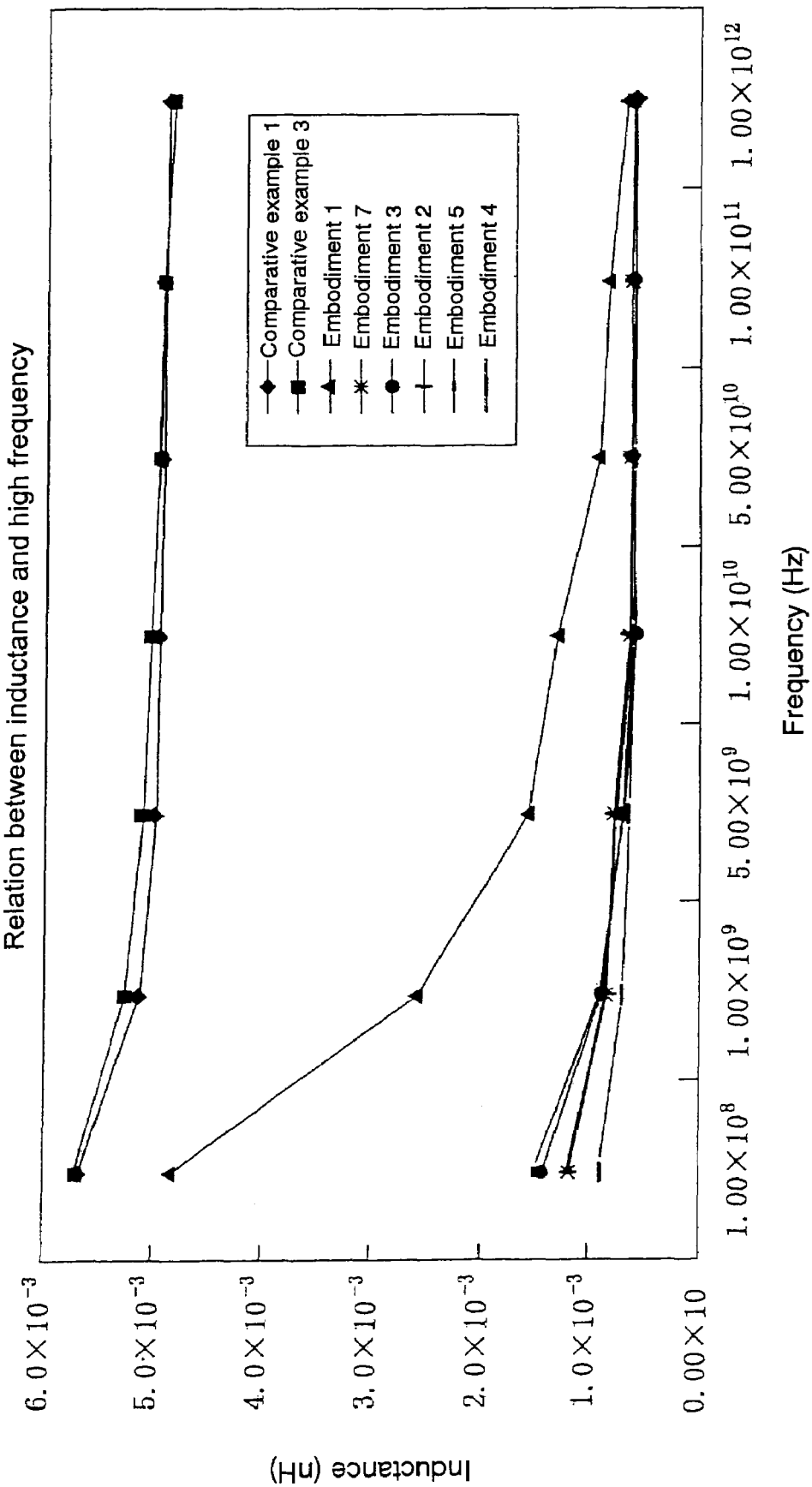

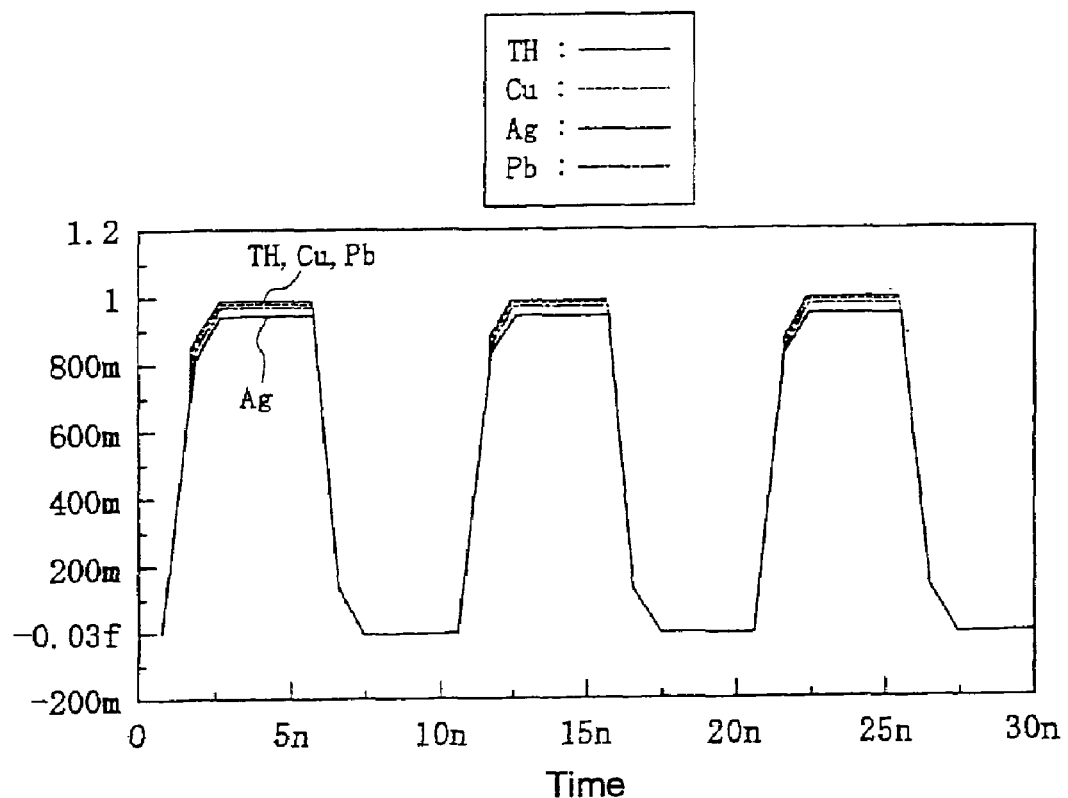
Fig 17 (a) Voltage waveform (100-MHz)
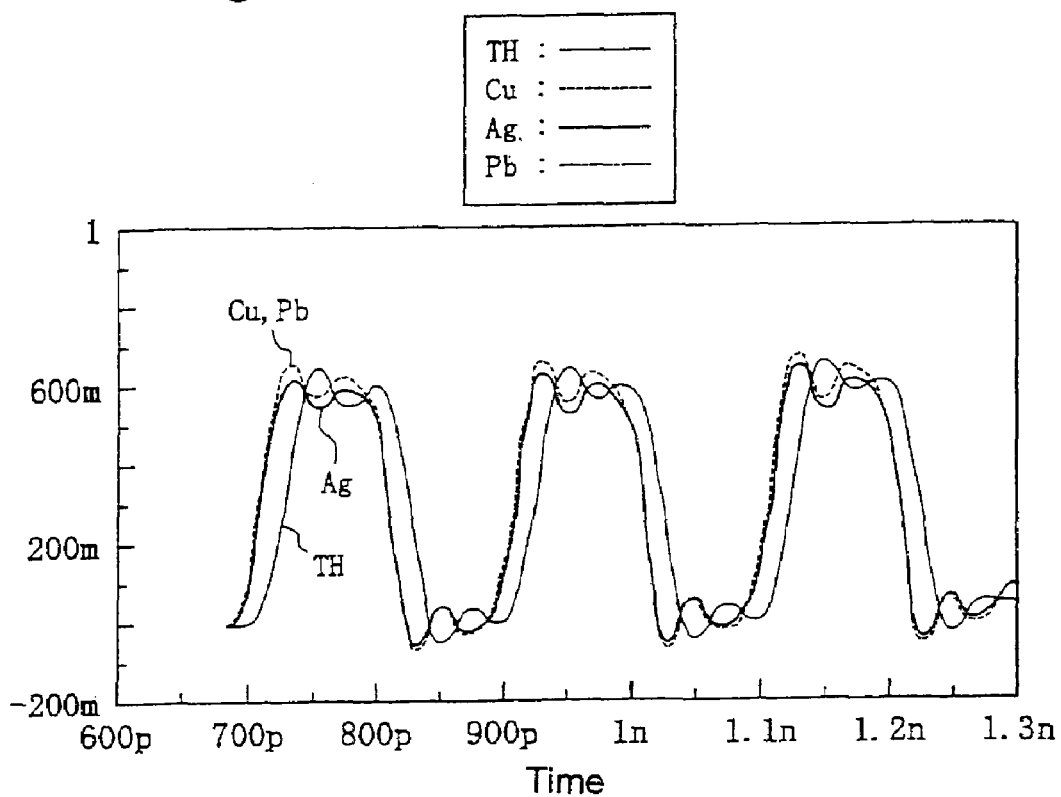
Fig. 17 (b) Voltage waveform (5-GHz)

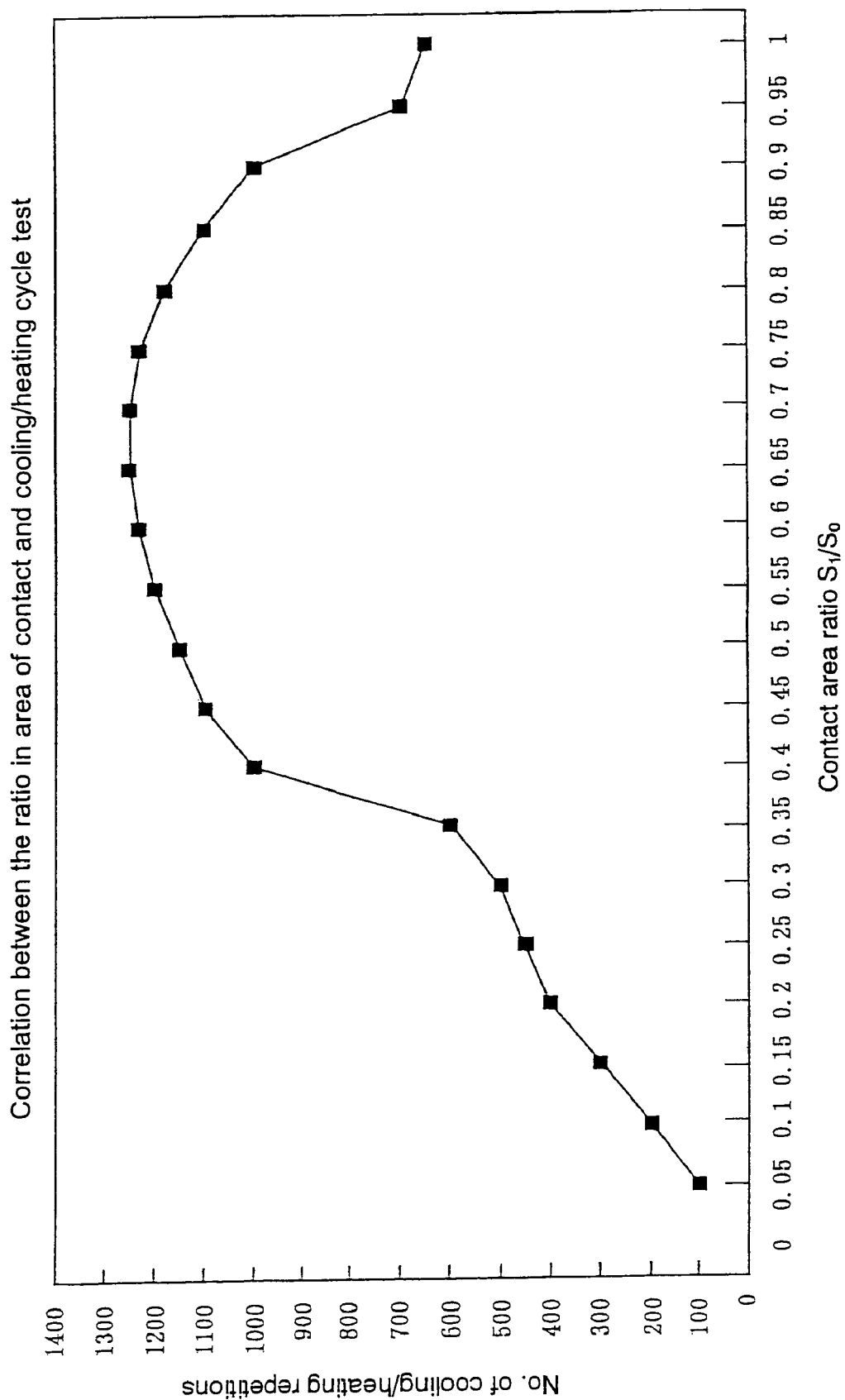

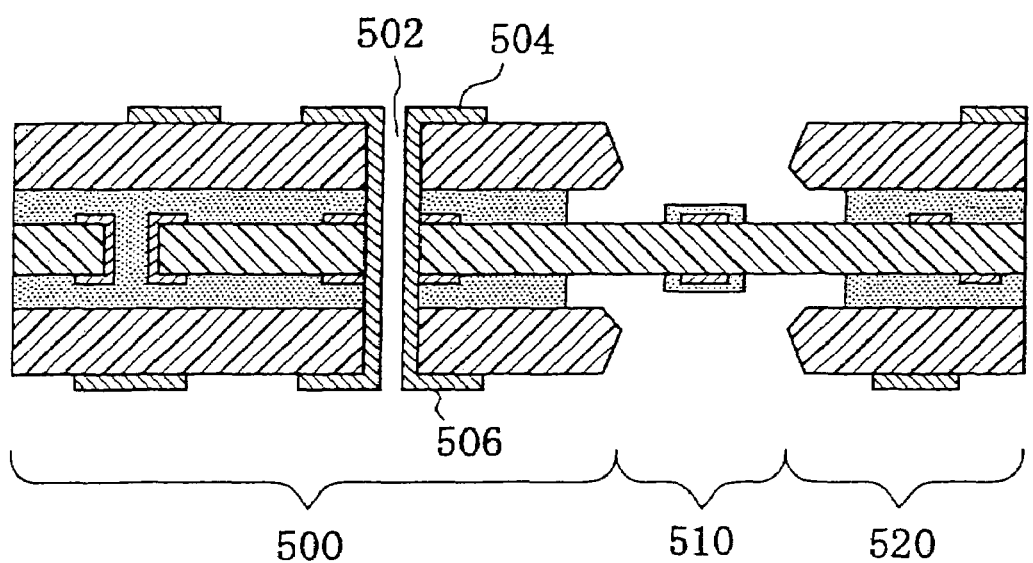

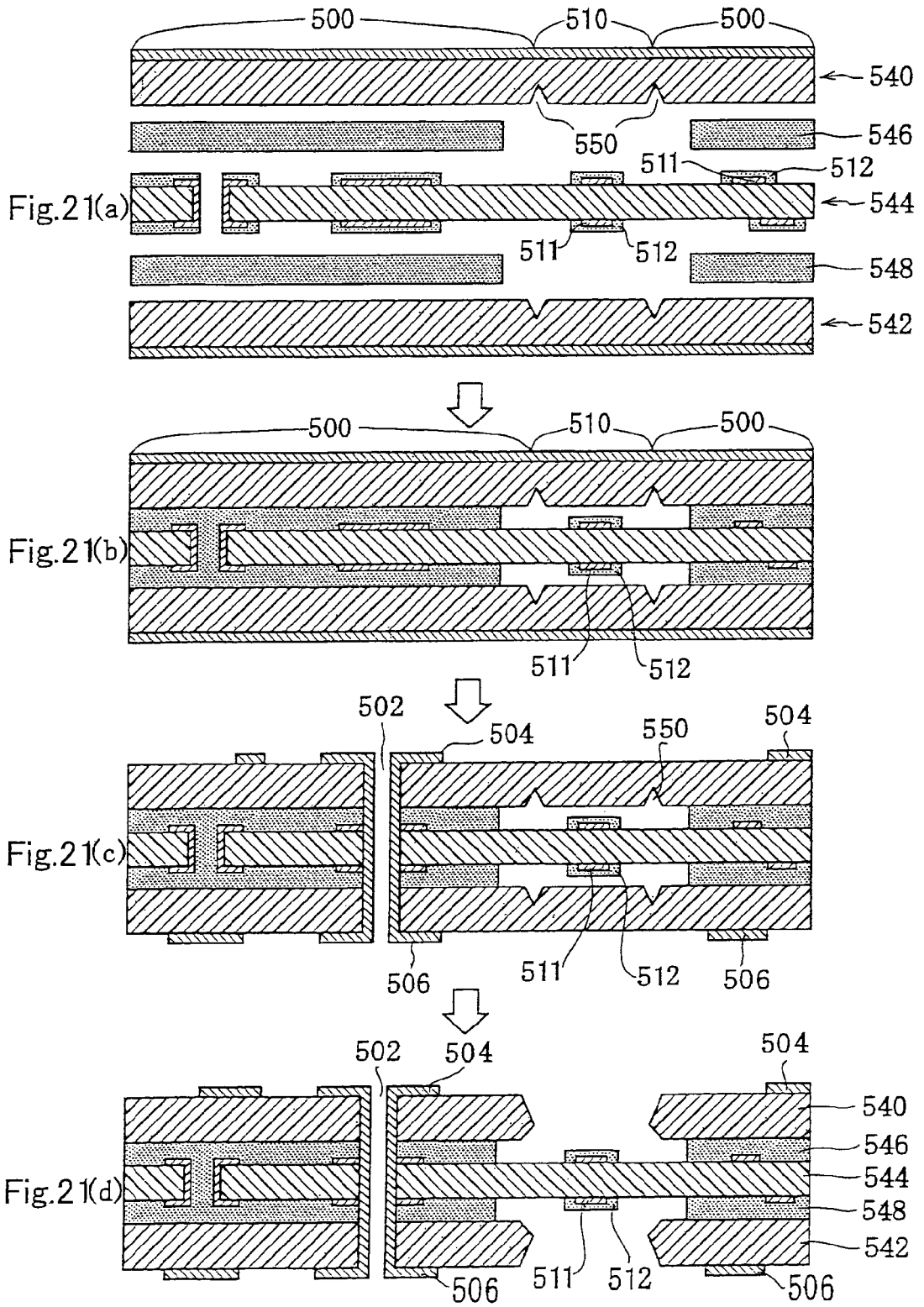

FLEX-RIGID WIRING BOARD

CROSS REFERENCE TO RELATED APPLICATIONS

The present application is a divisional application of U.S. application Ser. No. 10/546,298, filed Aug. 19, 2005, which is a continuation application of PCT/JP2004/05460, filed Apr. 16, 2004, claims the benefit of priority under 35 USC §119 to Japanese Patent Application No. 2003-113549 filed Apr. 18, 2003.

FIELD OF THE INVENTION

The present invention generally relates to a wiring board including a flexible substrate and rigid substrate, and more particularly to a flex-rigid wiring board wherein a flexible substrate and rigid substrate are lap-joined to each other in a rigid portion of the wiring board.

BACKGROUND ART

The recent portable electronic devices such as a foldable mobile phone and the like use a flex-rigid multilayer wiring board. FIG. 20 shows an example of such a conventional wiring board, in which rigid portions 500 and 520 are connected to a flexible portion 510 through a flexible substrate 544. Normally in the rigid portion 500, the flexible substrate 544 and pattern layers 504 and 506 on the surfaces of the rigid portions 500 and 520 are electrically connected to each other through a conductive layer in a plated through-hole 502 (cf. Japanese Patent Application Laid Open No. 90756 of 1993).

The conventional flex-rigid multilayer wiring board is manufactured in a manufacturing process shown in FIG. 21.

As shown in FIG. 21(a), prepared rigid substrates 540 and 542 and flexible substrate 544, and prepregs 546 and 548 for bonding the substrates 540, 542 and 544 to each other, are vertically lap-joined to each other. As shown, slits 550 are preformed in the rigid substrates 540 and 542 along the boundary between the rigid substrates 500 and 520 and flexible substrate 510.

Portions of the prepregs 546 and 548, corresponding to the flexible substrate 510, are cut off in advance. The flexible substrate 544 has formed on either side thereof a conductive pattern 511 which is protected by a coverlay 512.

The rigid substrate 540 and flexible substrate 544 are superposed one on the other as shown in FIG. 21(a), and joined to each other by pressing as shown in FIG. 21(b).

Then, the substrates thus lap-joined together are subjected to drilling, plating, patterning and the other process to form a wiring board having the pattern layers 504 and 506 formed on the surface thereof as shown in FIG. 21(c).

Note that at this stage, since the flexible substrate 544 in the flexible portion 510 is covered with the rigid substrates 540 and 542, the flexible substrate 544 will not be susceptible to any plating solution in the step of plating.

Thereafter, parts of the rigid substrates 540 and 542, corresponding to the flexible portion 510, are cut off along the slits 550 to form the flexible portion 510, thereby forming a flex-rigid multilayer wiring board as shown in FIG. 21(d).

The above conventional flex-rigid multilayer wiring board is manufactured following many steps such as placing a flexible substrate of polyimide film between rigid substrates of glass epoxy resin, glass polyimide resin or the like, and joining them together through prepregs or adhesive sheets by thermal compression bonding, then drilling, through-hole plating, photoresist application, etching and the like.

The above-mentioned conventional manufacturing process is not advantageous in that since the process after the thermal compression bonding as shown in FIG. 21(b) is complicated, the lead time for this process is relatively long. It is also disadvantageous in that in the step of cutting off a part of the rigid substrates (as shown in FIG. 21(d)), positioning in the direction of thickness has to be done accurately and cutting off the parts of the rigid substrates with a cutting tool or the like is often likely to result in scratching of the surfaces of the rigid substrates.

Also, the conventional flex-rigid wiring board is not advantageous in that it cannot be produced with any higher yield since it is formed from a combination of different materials, which leads to a displacement of them from each other due to a difference in thermal shrinkage between them during the thermal compression bonding, smear developed at the time of drilling, poor adhesion of the through-hole plating or the like.

Further, the conventional flex-rigid wiring board is disadvantageous in that the inter-layer connection is not highly reliable since the through-hole plate is likely to break away at the boundary between the through-hole formed through the flexible and rigid substrates and the substrates themselves because the substrates are different in thermal expansion coefficient from each other.

Moreover, the conventional flex-rigid multilayer wiring board basically includes a rigid substrate stacked on either side (front and back sides) of a flexible substrate and these substrates are electrically connected to each other through a through-hole formed through them.

In the above connection structure, signals are transmitted from one of the rigid substrates to the flexible substrate through the conductive layer plated on the wall of the through-hole but the conductive layer on the through-hole wall extending to the other rigid substrate is an unnecessary part through which the signals cannot be transmitted. The LC (inductance and capacitance) in the unnecessary part will cause a signal delay, and particularly a signal delay in a band of giga-level frequency, and a signal reflected at such an unnecessary part will disturb the signal waveform.

Also, since the aforementioned conventional flex-rigid wiring board is limited to a substrate configuration in which the flexible substrate is led out from the lateral side of the multilayer rigid substrate, it cannot produce any substrate configuration in which substrates are connected to each other with a high freedom of wiring.

Further, the flex-rigid wiring board is housed in a portable electronic device. To assure that the device housing the wiring board, even if dropped, will not easily be faulty, the wiring board itself is required to be able to withstand any dropping.

DISCLOSURE OF THE INVENTION

The present invention has an object to overcome the above-mentioned drawbacks of the related art by providing a flex-rigid wiring board effective for reduction of the inductance in a high-frequency band as well as of a noise caused by signal delay or reflected signal-wave and which can be manufactured with a high reliability on the inter-layer connection and others, high freedom of wiring and a high yield.

To attain the above object, the Inventors of the present invention had devoted themselves to researches about the interlayer connection between a flexible substrate and rigid substrate mainly in a rigid portion of a flex-rigid wiring board. As the result, the Inventors found it possible to overcome all the above-mentioned drawbacks of the related art by forming interconnecting electrode pads on the rigid substrate and also in positions on the flexible substrate, opposite to the interconnecting electrode pads on the rigid substrate, joining the rigid and flexible substrates to each other with an insulative adhesive, and connecting the interconnecting electrode pads electrically and physically to each other through a conductor lump penetrating the insulative adhesive, and thus worked out the present invention.

The above object can be attained by providing a flex-rigid wiring board in which a rigid substrate having a conductive layer including an interconnecting electrode pad and a flexible substrate having a conductive layer including an interconnecting electrode pad are lap-joined and electrically connected to each other, wherein an insulative adhesive is interposed between portions, lapping over each other, of the rigid and flexible substrates and the interconnecting electrode pads on the rigid and flexible substrates are electrically connected to each other through a conductor lump penetrating the insulative adhesive.

Note that in the following description, the substrate referred to simply as a flexible or rigid substrate include both a single-layer one and a multilayer one. Also, it goes without saying that in the present invention, the insulative adhesive does not include any one containing a resin as a base and conductive particles dispersed in the resin and which becomes conductive when pressed, such as an anisotropic conductive resin.

In the above flex-rigid wiring board according to the present invention, a plurality of rigid substrates should desirably be lap-joined to one flexible substrate to provide a multilayer structure.

The reason for the above is that when the flex-rigid wiring board is incorporated in a mobile phone, for example, increasing or decreasing the number of the rigid substrates as necessary enables to easily fit other mounted parts and the shape of the phone casing.

In the flex-rigid wiring board according to the present invention, the conductor lump should desirably be provided, to project, on the interconnecting electrode pad provided on either the rigid substrate or flexible substrate.

The reason for the above is that the conductor lump can penetrate the insulative adhesive more easily and the rigid and flexible substrates can be lap-joined to each other more easily.

Also, the interconnecting electrode pad should desirably be formed on one or both sides of each of the rigid and flexible substrates.

The reason for the above is that the number of rigid substrates to be lap-joined to the flexible substrate can be increased more easily, the rigid and flexible substrates be connected electrically and physically to each other more positively and the interconnecting electrode pad be formed with an improved accuracy.

Also, for the interconnecting electrode pad to be formed on either side of the flexible substrate, a via-hole may be formed through the flexible substrate to electrically connect the interconnecting electrode pads to each other.

In the flex-rigid wiring board according to the present invention, the rigid substrate may be connected electrically to a plurality of places on the flexible substrate, and the rigid substrate including a conductive layer and insulative resin layer may be formed to have a single-layer or multilayer structure. Each of the rigid substrates thus formed individually are lap-joined to one side or both sides of the flexible substrate through a conductor lump.

The interconnecting electrode pad on the rigid substrate may be formed over the surface of the latter or on a limited area of the latter.

FIG. 1 schematically illustrates overlapping of the rigid and flexible substrates, forming together the flex-rigid wiring board according to the present invention.

In the flex-rigid wiring board according to the present invention, the range of joint between the rigid and flexible substrates, namely, the area B where the rigid and flexible substrates overlap each other should desirably be under 40% of the surface area A of the rigid substrate.

Since the above overlapping range assures that there occurs less problems due to a difference in coefficient of thermal expansion between the materials forming the rigid and flexible substrates, respectively, the reliability on the connection between the substrates is improved as having been proved by the reliability tests such as the thermal shock test (by cooling/heating cycle) or the like.

The overlapping range should preferably be with a range over 5% and under 40% of the surface area of the rigid substrate, the interconnecting electrode pads should preferably be connected to each other through a conductor lump within the overlapping range, and the rigid and flexible substrates should preferably be joined with an insulative adhesive to each other.

The reason for the above is that an overlapping range under 5% of the surface area of the rigid substrate cannot assure any sufficient adhesion between the rigid and flexible substrates, the flex-rigid wiring board cannot have any sufficient strength and a problem is likely to take place in connection between the pads as having been proved by the result of the strength tests such as tensile test made on the flex-rigid wiring boards. On the other hand, if the overlapping range exceeds 40% of the surface area of the rigid substrate, there will take such a large influence of the difference in coefficient of thermal expansion between the flexible and rigid substrates, the coefficient of thermal expansion of the flexible substrate being relatively large while that of the rigid substrate is relatively small, that an electrical discontinuity is likely to take place.

That is, with the overlapping range over 5% and under 40% of the surface area of the rigid substrate, it is possible to keep a sufficient adhesion between the rigid and flexible substrates and prevent any electrical discontinuity from being caused by a cooling/heating cycle, thereby permitting an improved electrical connection.

Also, the overlapping range should more preferably be over 10% and under 25% of the surface area of the rigid substrate. With this overlapping range, the influence of the difference in coefficient of thermal expansion between the materials of the rigid and flexible substrates, respectively, can be reduced to improve the electrical connection and connection reliability with cancellation of other possible problems.

In the flex-rigid wiring board according to the present invention, there should desirably be formed a stack structure in which the interlayer connection of the rigid substrate is aligned in position with that of the flexible substrate for overlapping and electrical conduction between these interlayer connections. The reason for the stack structure is that the wiring length can be reduced, which is suitable for mounting electronic parts which need a large power for operation.

Also, the strength around the stack structure is increased, the stress caused by the cooling/heating cycle is suppressed for an improved electrical connection.

On the assumption that of the interconnecting electrode pads formed on the rigid and flexible substrates, respectively, one whose area of contact with the conductor lump is smaller has an area $S_0$ while the area of contact between the interconnecting electrode pad and conductor lump is $S_1$, the ratio $S_1/S_0$ between the areas should preferably be $0.4 \leq S_1/S_0 \leq 0.9$.

The reason for the above is that with the area ratio $S_1/S_0$ of less than 0.4, the contact area is too small for reliable electrical and physical connection between the rigid and flexible substrates to be assured while with the area ratio $S_1/S_0$ of larger than 0.9, the contact portion of the conductor lump is too large for the electrical continuity to be satisfactory between the rigid and flexible substrates under the influence of the expansion and shrinkage of the conductor lump.

In the flex-rigid wiring board according to the present invention, the conductor lump should preferably a bulk conductor having the shape of a convex-curve, spherical or hemispheric, a column, prismatic or cylindrical, a cone, pyramidal or circular, or a pin. The conductor lump is formed from a conductive material selected from among metals such as copper, gold, silver, tin, etc. or their alloys, and various kinds of solder.

The convex-curve, columnar or conical conductor lump should preferably be formed by plating, printing, transferring, implanting, electrodepositing or the like. As the conductor lump, a circular-conical bump is suitably used, which is made by forming a metal paste by printing and then curing it.

The reason for the above is that the conical bump can easily penetrate an insulative adhesive layer when the rigid and flexible substrates are lap-joined to each other and a compressed deformation of the free end of the conical bump allows the rigid and flexible substrates to be lap-joined to each other with an increased area of contact between them.

Also, the increased area of contact assures the electrical continuity between the rigid and flexible substrates even if a stress develops due to a cooling/heating cycle, that is, it assures an improved connection reliability.

In the flex-rigid wiring board according to the present invention, in case the conductor lump is a conical bump as above, the insulative adhesive layer formed between the rigid and flexible substrates should preferably be formed from a prepreg because the conical bump can easily penetrate the layer.

Also, the conductor lump may be a bump formed from a copper plate. Such a conductor lump should desirably be formed being connected through a solder layer to the interconnecting electrode pad provided on the flexible substrate.

Also, the conductor lump may be a bump formed from an Sn—Ag plate. The Sn—Ag plate is a lead-free solder. Being excellent in malleability, the Sn—Ag plate can effectively suppress the stress developed due to a cooling/heating cycle.

In the flex-rigid wiring board according to the present invention, the rigid and flexible substrates can be connected to each other also by fitting a pin-shaped conductor lump into through-hole-shaped interconnecting electrode pads provided on the substrates, respectively. The inter-substrate connection through the pin-shaped conductor lump makes it possible to separate the rigid and flexible substrates from each other as necessary and also assure a resistance against a stress developed in a direction parallel to the substrate surfaces.

In the flex-rigid wiring board according to the present invention, the rigid and flexible substrates should desirably be connected electrically to each other with a solder bump formed by transferring on any of the interconnecting electrode pads on the rigid and flexible substrates.

The reason for the above is that the solder bump formed by transferring can be transferred in shape more positively than the bump formed by printing and thus the resin will not remain not transferred. The connected can be more stable.

The present invention is advantageous as follows:
(a) Wiring can freely be made with a high connection reliability.
(b) The inductance in the high-frequency band can be reduced, signal-delay time can be reduced, and noise developed due to signal reflected-wave can be suppressed.
(c) Connection by the conductor lump permits to solve the problem of a migration likely to take place between conductors at a high temperature and humidity.
(d) The insulative adhesive can prevent the dropping impact resistance from being lower.
(e) The flex-rigid wiring board can be manufactured with a reduced cost and high yield.

These objects and other objects, features, and advantages of the present invention will become more apparent from the following detailed description of the preferred embodiments of the present invention when taken in conjunction with the accompanying drawings. It should be noted that the present invention is not limited to the embodiments but can freely be modified without departing from the scope and spirit thereof defined in the claims given later.

BRIEF DESCRIPTION OF THE DRAWINGS

FIGS. 6(a) to 6(e) show some steps of a process of manufacturing a flex-rigid wiring board according to a second example of the present invention.

FIG. 10 shows a flex-rigid wiring board according to a fifth example of the present invention.

FIGS. 11(a) to 11(c) show some steps of a process of manufacturing a flex-rigid wiring board according to a sixth example of the present invention.

FIG. 16 shows the relation between inductance and high frequency.

FIG. 17(a) illustrates a voltage waveform having a delay of a 100-MHz signal, and FIG. 17(b) illustrates a voltage waveform having a delay of a 5-GHz signal.

FIG. 19 illustrates a correlation between the ratio in area of contact between a conductor lump and interconnecting electrode pad and number of times of heating and cooling in a cooling/heating cycle test made on the example 8.

FIG. 20 is a schematic sectional view of the conventional flex-rigid wiring board.

FIGS. 21(a) to 21(d) show the process of manufacturing the conventional flex-rigid wiring board.

BEST MODE FOR CARRYING OUT THE INVENTION

Figure 1:
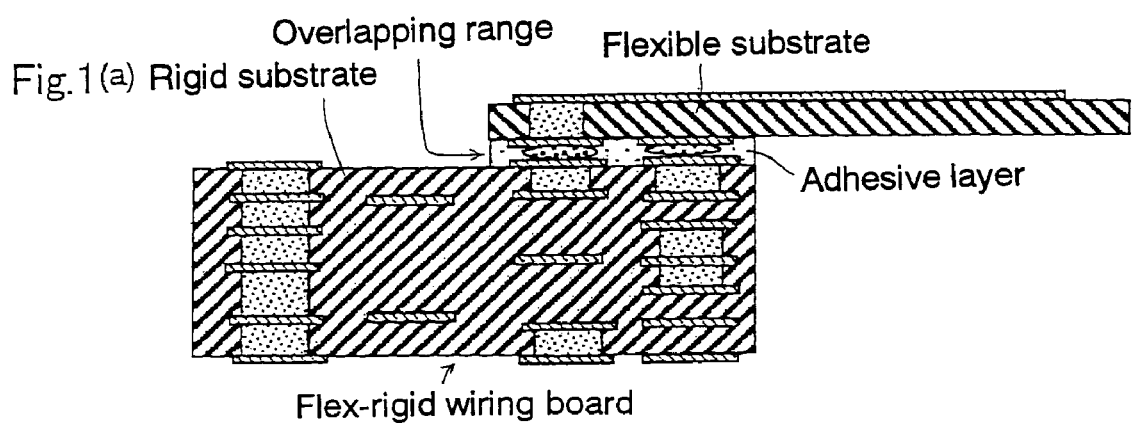
FIGS. 1(a) and 1(b) show a flex-rigid wiring board according to the present invention, schematically illustrating overlapping of a rigid substrate and flexible substrate, forming together the flex-rigid wiring board.
Figure 1:
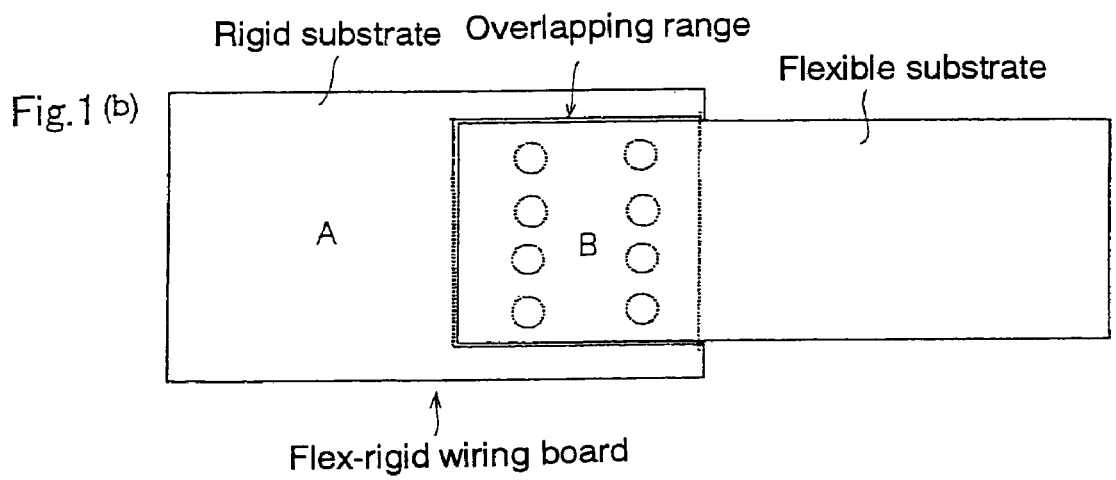
Figure 2A:
FIGS. 2(a) to 2(d) show some steps of a process of manufacturing a flex-rigid wiring board according to a first example of the present invention.
Figure 2B:
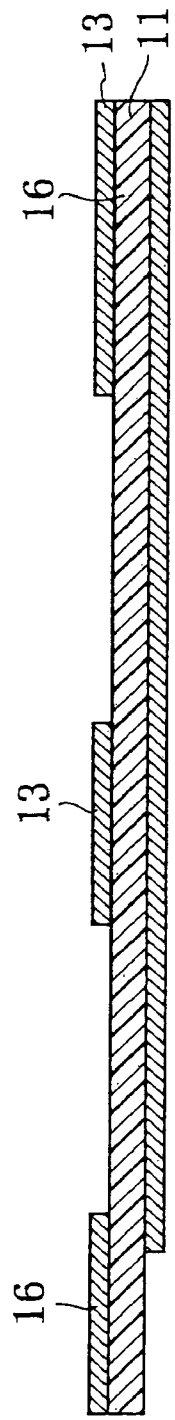
Figure 2C:
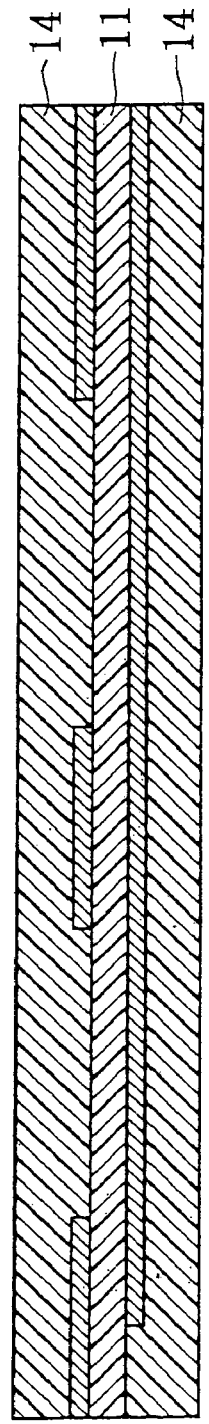
Figure 2D:
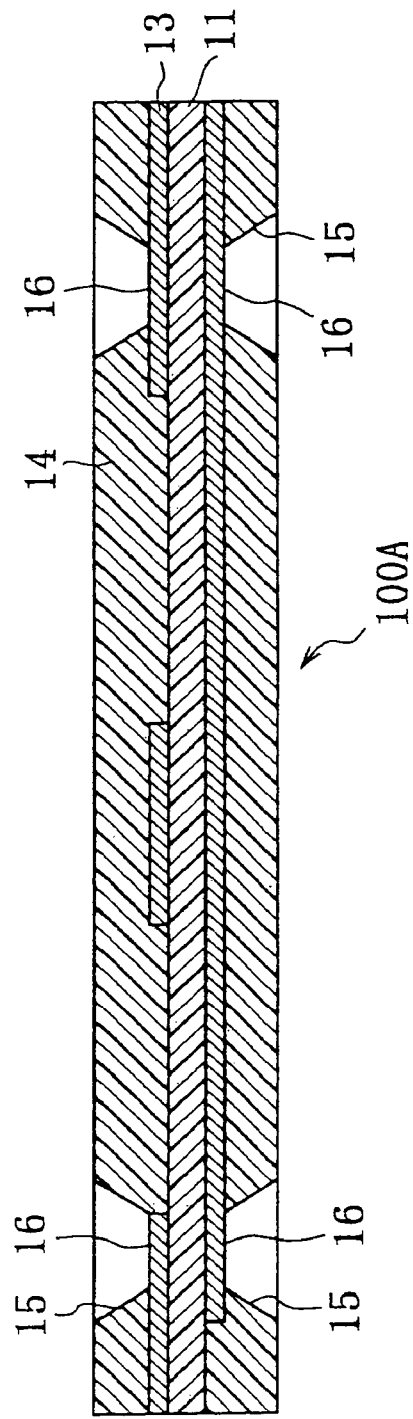
Figure 3A:
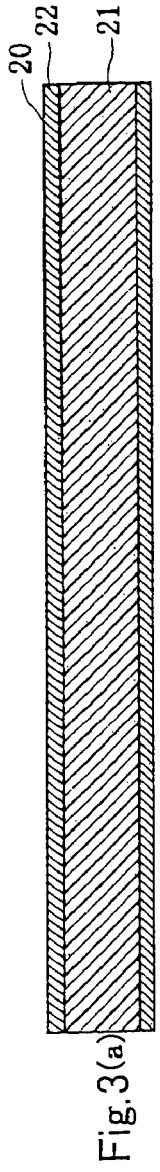
FIGS. 3(a) to 3(f) show still other steps of the process of manufacturing a flex-rigid wiring board according to the first example of the present invention.
Figure 3B:
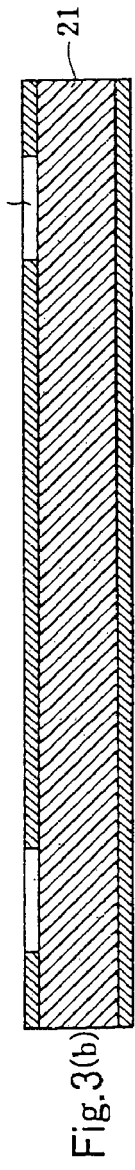
Figure 3C:
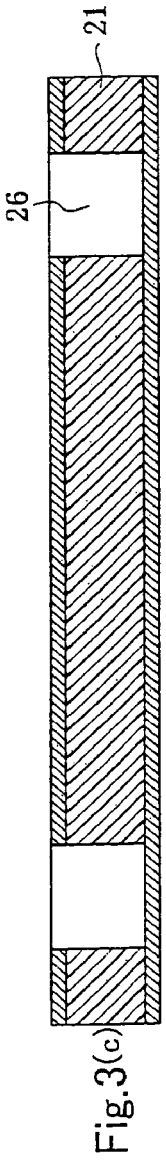
Figure 3D:
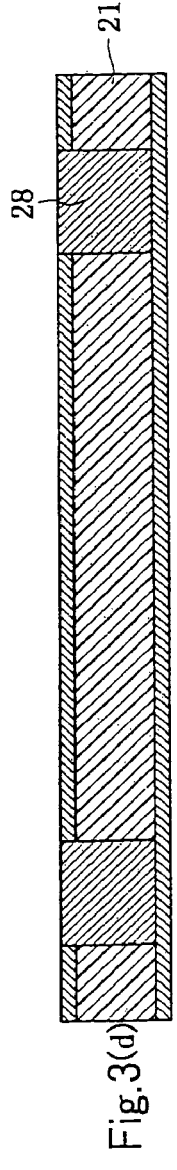
Figure 3E:
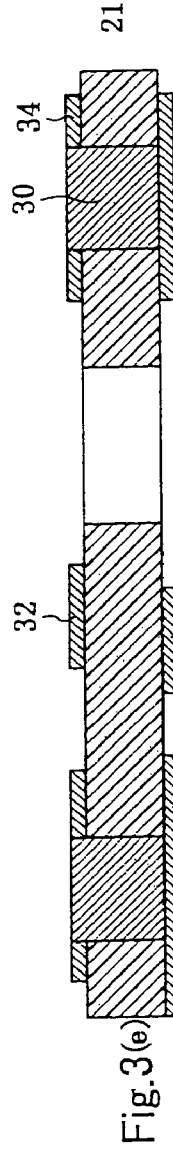
Figure 3F:
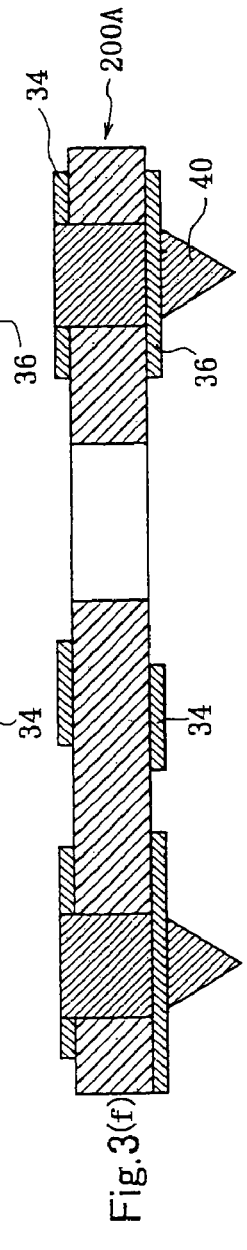

The flex-rigid wiring board according to the present invention is characterized in that a rigid substrate a conductive layer including an interconnecting electrode pad and a flexible substrate are lap-joined to each other with an insulative adhesive being interposed in at least the range of overlapping between the rigid and flexible substrates and interconnecting electrode pads provided on each of the rigid and flexible substrates are connected electrically and physically to each other through a conductor lump provided to penetrate the insulative adhesive.

Note that the "conductor lump" incorporated as a structural feature in the flex-rigid wiring board according to the present invention may be a bulk conductor or an aggregate of conductive particles, having the shape of a convex-curve, spherical or hemispheric, a column, prismatic or cylindrical, a cone, pyramidal or circular, or a pin. Namely, it may be a means which can electrically connect the interconnecting electrode pads provided on the rigid and flexible substrates, respectively, to each other with a sufficient strength.

The flexible substrate used in the present invention may be an appropriately flexible substrate such as a plastic substrate, metallic substrate, film substrate or the like.

More specifically, the flexible substrate may be a glass epoxy substrate, glass polyimide substrate, aluminum substrate, iron substrate, polyimide film substrate, polyethylene film substrate, LCP (liquid crystal polymer) substrate or the like. Among others, a substrate including, as a base, a polyimide film having an electrical circuit formed on one side or both sides thereof is suitably usable as the flexible substrate.

The flexible substrate should preferably have a thickness of about 10 to 100 μm. With a thickness smaller than 10 μm, the substrate will be poorer in electric insulation. If the thickness is larger than 100 μm, the substrate will be lower in flexibility.

The flexible substrate has an electrical circuit including interconnecting electrode pads formed on one side or both sides of the substrate. The electrical circuit is formed by plating the surface of an insulative film or etching a metal foil attached to the surface of an insulative film, and the interconnecting electrode pad is formed as a part of the electrical circuit.

The above interconnecting electrode pad may be a via-land penetrating the substrate to electrically connect with another electrical circuit. The flexible substrate and a rigid substrate which will be described in detail later may be connected electrically to each other through such via-lands.

The interconnecting electrode pad formed on the flexible substrate should preferably be circular in shape, has a diameter of about 50 to 500 μm, and formed in a plurality of places with a pitch of about 100 to 700 μm.

The reason for the above is that if the diameter is smaller than 50 μm, the connection reliability will be poor and a diameter of more than 500 μm will lead to an increased area for the pads, which will be disadvantageous for a higher packaging density.

According to the present invention, the rigid substrate included in the flex-rigid wiring board is a substrate not flexible like the flexible substrate. It should be rigid, not easily deformable, independently of its form, number, method of preparation, etc.

The insulative resin base of the rigid substrate may be a rigid one selected from among a glass fabric epoxy resin substrate, glass fabric bismaleimide triazine resin substrate, glass fabric polyphenylene ether resin substrate, aramid nonwoven fabric-epoxy resin substrate and aramid nonwoven fabric-polyimide resin substrate. The glass fabric epoxy resin substrate is the most preferable one for the insulative resin base.

The insulative resin base should be on the order of 20 to 600 μm in thickness. If the thickness is less than 20 μm, the insulative resin base is lower in strength and cannot easily be handled. The electrical insulation will be lower in reliability. With a thickness exceeding 600 μm, any fine via-hole cannot be formed through the base and cannot be filled with conductive material and the substrate itself will be thicker.

The insulative resin base is plated on one side or both sides thereof with a copper foil having a thickness of 5 to 18 μm. If the thickness is smaller than 5 μm, an opening for forming a via-hole in the insulative resin base will penetrate the base. On the contrary, with a thickness of more than 18 μm, it will be difficult to form, by etching, an electrical circuit pattern having thin conductors.

The rigid substrate including the insulative resin base and copper foil may use, among others, a single-sided copper clad laminate which can be formed by stacking a prepreg formed by impregnating a glass fabric with an epoxy resin and cured to the B stage and a copper foil and pressing them at a high temperature. Such a rigid substrate is excellent in accuracy of positioning without displacement of the wiring pattern and via-hole position during handling after etching the copper foil.

Note that the above electrical circuit formed on one side or both sides of the rigid substrate should preferably be formed by pressing, at a high temperature, a copper foil of about 5 to 18 μm in thickness through a resin adhesive layer kept in an uncured state and then etching it appropriately.

The electrical circuit should preferably be formed by attaching an anti-etching film on the copper foil attached to the base surface, covering a specified circuit pattern with a mask and etching the copper foil to provide an electrical circuit including electrode pads (via-lands).

In the above electrical circuit forming process, a photosensitive dry film resist is first attached to the surface of the copper foil, then exposed to light along the specified circuit pattern and developed to form an etching resist, and the metal layer where no etching resist is formed is etched to provide an electrical circuit including electrode pads.

The etchant used in the above process may be at least one selected among aqueous solutions of sulfuric acid-hydrogen peroxide, persulfate, cupric chloride and ferric chloride.

Also, in a pre-processing to form an electrical circuit by etching the copper foil, the entire surface of the copper foil may be pre-etched to thin the copper foil to a thickness of about 1 to 10 µm, more preferably, to a thickness of about 2 to 8 µm in order to form a fine pattern more easily.

The shape, size and number of the interconnecting electrode pads formed on the rigid substrate are not limited any specific ones. However, the pad should be formed as a circle whose diameter is about 50 to 500 µm and at a plurality of places with a pitch of about 100 to 700 µm, for example. With a pad diameter of less than 50 µm, the connection is not highly reliable. With a diameter exceeding 500 µm, the pad will has an increased area, which is disadvantageous for a higher packaging density.

If the pad interval is less than 100 µm, a problem such as short-circuit is likely to take place, resulting in a lower reliability on the connection. If the pad interval is larger than 700 µm, the pad will have a large area, which is disadvantageous for a high density of packaging.

In the insulative resin base, there is formed an opening for forming a via-hole (will be referred to as "via opening" hereunder). The via opening can be formed by laser irradiation. More specifically, a transparent protective film, for example, a PET film, is attached to the surface of the insulative resin base, a carbon dioxide laser is irradiated from above the PET film to form an opening through the PET film, which extends from the surface of the insulative resin base to the copper foil. Under these processing conditions, the via opening should desirably have a diameter of about 50 to 250 µm. If the opening diameter is less than 50 µm, it is difficult to form the via opening itself and the conductor lump is too small to assure any reliable connection. With a via opening diameter of more than 250 µm, a wider area is required for forming the via opening, which will make it possible to attain a high packaging density.

Note that for removing resin left on the side and bottom surfaces of the via opening formed by the laser irradiation, the insulative resin base undergoes desmearing. The desmearing is done by any of oxygen plasma discharge, corona discharge, ultraviolet laser irradiation and excimer laser irradiation.

The via opening is filled with a conductive material to form a filled via-hole. The conductive material should preferably be a conductive paste or a metal plate formed by electroplating.

For manufacturing the flex-rigid wiring board with less cost and improved yield by simplifying the filled via-hole forming process, the via opening should preferably be filled with a conductive paste. For an improved connection reliability, the via opening should preferably be filled with a metal plate formed by electroplating, such as copper, tin, silver, various types of solders, copper/tin plate, copper/silver plate or the like. Among others, the electrolytic copper is preferable for filling in the via opening. The electrolytic copper is excellent in easiness of filling when forming a filled via-hole and in electrical performance. Also, the electrolytic copper is advantageous in easy suppression of the stress.

The conductive material may not only be filled in the via opening penetrating the insulative resin base and extending to the electrical circuit but also be projected to a specified height out of the via opening. The projection should desirably be as high as falling within a range of 5 to 30 µm.

If the projection height is less than 5 µm, the connection is likely to be poor. With a projection height exceeding 30 µm, the resistance of the conductive material will be higher, and the conductive material will spread too much along the surface of the insulative resin base and no fine pattern can be formed when it is thermally deformed in the hot pressing process.

In the flex-rigid wiring board according to the present invention, the rigid and flexible substrates may be connected electrically to each other in any of the following manners (1) to (4). By adopting an arbitrary combination of the connecting manners, the substrate material can effectively be used and the substrates be connected to each other with a high freedom of wiring.

(1) In case a flexible substrate is connected to one side of a rigid substrate, an interconnecting electrode pad is formed on one outermost surface of the rigid substrate, and an interconnecting electrode pad is formed on one side of the flexible substrate to connect the electrode pads on the respective substrates to each other through a conductor lump.

(2) In case different flexible substrates are connected to both sides of a rigid substrate, respectively, an interconnecting electrode pad is formed on either outermost surface of the rigid substrate and each of the flexible substrates is disposed opposite to the interconnecting electrode pads formed on both sides of the rigid substrate to connect the opposite interconnecting electrode pads opposite to each other through a conductor lump.

(3) In case different rigid substrates are connected to both sides of a flexible substrate, respectively, an interconnecting electrode pad is formed on either side of the flexible substrate and the different rigid substrates having interconnecting electrode pads formed on one outermost surface thereof oppositely to the interconnecting electrode pads on the flexible substrate are disposed for the interconnecting electrode pads on the substrates to be opposite to each other to connect the mutually opposite interconnecting electrode pads to each other through a conductor lump.

(4) In case a plurality of rigid substrates is connected electrically to a plurality of places on a flexible substrate, the plurality of rigid substrates is pre-formed to have an arbitrary number of conductive layers and an arbitrary number of insulative resin layers, interconnecting electrode pads formed on the individually formed rigid and flexible substrates are disposed opposite to each other and the mutually opposite interconnecting electrode pads are connected to each other through a conductor lump.

Among the above four connecting manners (1) to (4), the first one (1) in which a flexible substrate is connected to one outermost surface of a rigid substrate will be explained herebelow.

For example, a plurality of interconnecting electrode pads as a part of the electrical circuit is pre-formed in a specified surface area along the shorter side of one outer surface of the rigid substrate, a plurality of interconnecting electrode pads corresponding to the interconnecting electrode pads formed on the rigid substrate is pre-formed in a specific area on one side of the flexible substrate, for example, a surface area along the shorter side of an elongated rectangular substrate, and these pluralities of interconnecting electrode pads in pair are connected electrically and physically to each other through conductor lumps pre-disposed on the interconnecting electrode pads on the rigid substrate or flexible substrate.

Further, the interconnecting electrode pads are connected to the rigid and flexible substrates with an insulative adhesive layer formed, by attaching or application, on a surface area on the rigid or flexible substrate, where no interconnecting electrode pad is formed.

When forming an electrical circuit by plating or etching one or two circuit boards forming the outermost layer of the rigid substrate, the interconnecting electrode pad may be formed as a part of the electrical circuit, independently on the insulative resin layer on the circuit board forming the outermost layer or as a via-land penetrating the insulative resin layer to electrically connect to the lower electrical circuit.

In the flex-rigid wiring board according to the present invention, the area where the interconnecting electrode pad on the rigid substrate is to be formed may not necessarily be the entire surface of the insulative resin layer as the outermost layer of the rigid substrate but may be in an arbitrary position where a sufficiently strong connection will be assured.

For example, the above area may be a peripheral surface area along the shorter or longer side of a rectangular substrate or a surface area extending from the periphery toward the center of a substrate.

Since an area may thus be selected in which the interconnecting electrode pad is to be formed, wires can be led out in any directions correspondingly to a design of the casing of an electronic device in which the flex-rigid wiring board is to be built in and layout of other rigid substrates and electronic parts housed in the device casing. The wiring in this flex-rigid wiring board is thus extremely advantageous.

A stack wiring board structure formed with the interlayer connection of the rigid substrate being coincident with that of the flexible substrate, the interlayer connections being placed to lap-join them through a conductor lump, as having been described in the foregoing, is one of the preferred examples of the present invention. Employment of such a stack wiring board structure implements a reduced wiring length, and permits to provide a preferable flex-rigid wiring board for packaging electronic parts operable on a large power.

On the assumption that of the interconnecting electrode pads formed on the rigid and flexible substrates, respectively, one whose area of contact with the conductor lump is smaller has an area $S_0$ while the area of contact between the interconnecting electrode pad and conductor lump is $S_1$, the ratio $S_1/S_0$ between the areas should preferably be $0.4 \leq S_1/S_0 \leq 0.9$.

With the area ratio $S_1/S_0$ of less than 0.4, the contact area is so small that no sufficient electrical and physical connection between the rigid and flexible substrates can be assured. If the area ratio $S_1/S_0$ is larger than 0.9, the flexible and rigid substrates are largely displaced in relation to each other and electrical discontinuity is likely to take place between the rigid and flexible substrates. Thus, no highly reliable connection can be attained between these substrates in this case.

The conductor lump connecting the interconnecting electrode pads provided on the rigid and flexible substrates, respectively, to each other should desirably be provided to project on the interconnecting electrode pad provided on either the rigid substrate or flexible substrate because it can easily penetrate the insulative adhesive layer when the rigid and flexible substrates are placed to overlap each other.

The conductor lump is typically formed to have the shape of a smooth convex-curve, spherical or hemispheric, a column, prismatic or cylindrical, a bump (post), pyramidal or conical, a ball or a pin by plating, printing, transferring, implanting, electro deposition or the like of a metal selected among copper, gold, silver, tin or the like or their alloy or various solders. However, it is not limited to any of these examples but it may be a means which can electrically connect the interconnecting electrode pad provided on the rigid substrate and that on the flexible substrate to each other with a sufficient strength.

In case the conductor lump is the above-mentioned bump (post) formed by plating, it may be formed by plating copper. In this case, the conductor lump should preferably be connected to the interconnecting electrode pad on the flexible substrate through a solder layer because it assures an excellent electrical continuity through itself.

Also, the solder for the bump (post) or ball may be selected from among Sn/Pb, Sn/Sb, Sn/Ag, Sn/Ag/Cu, Sn/Cu, Sn/Zn and Sn/Ag/In/Cu solders.

That is, the solder may be either one selected from the above-mentioned metals or solders or a mixture of two or more of the metals or solders.

Among others, a bump formed from a solder containing no lead, namely, a so-called lead-free solder, should preferably be used not to pollute the natural environment. Such solders include, for example, Sn/Sb, Sn/Ag, Sn/Ag/Cu, Sn/Cu, Sn/Zn and Sn/Ag/In/Cu solders. Taking account of the material of each of the rigid and flexible substrates, an Sn-37Pb solder whose melt point is 183° C. or an Sn-35Ag-0.7Cu solder whose melt point is 217° C. is more preferable for use to form the bump as the conductor lump.

Further, a bump formed by plating the Sn/Ag solder is more preferable since it is excellent in malleability and can effectively suppress the stress developed in the cooling/heating cycle.

The solder bump should preferably have a height of about 10 to 150 μm. This solder bump can be formed by plating, printing, transferring, implanting, electro deposition or the like.

To form the solder bump by printing, a printing mask (metal mask) having a circular opening formed therein is placed in a position on a rigid or flexible substrate, corresponding to the interconnecting electrode pad on the substrate, a solder paste is applied over the mask and heated to form the solder bump.

Also, to form the solder bump by transferring, a rigid or flexible substrate having an interconnecting electrode pad provided thereon, solder carrier and retaining jig as a weight are placed one after another on the horizontal surface of a horizontal jig, for example, the substrate and solder carrier are held tight between the horizontal jig and retaining jig and held horizontally, then the solder pattern of the solder carrier is transferred by reflowing to the interconnecting electrode pad, and the solder carrier is removed to form a solder bump on the interconnecting electrode pad.

Further, the solder ball may be formed from a copper ball of 100 to 800 μm in diameter and a solder layer having a thickness of less than 150 μm and which covers the copper ball.

The rigid and flexible substrates should preferably be connected to each other electrically and physically by pressing the interconnecting electrode pad on the flexible substrate to the solder bump or ball on the interconnecting electrode pad of the rigid substrate, heating the solder bump or ball to melt the latter, and then curing the melted solder.

In the flex-rigid wiring board according to the present invention, the resin forming the insulative adhesive layer for attaching the rigid and flexible substrates to each other and securing them and the conductor lump is to penetrate may be selected from among polyvinyl butyral resin, phenol resin, nitrile rubber, polyimide resin, phenoxy resin, xylene resin or a mixture of two or more of them, polycarbonate resin, polysulfon resin, polyether imide resin, liquid crystal polymer, polyamide resin, etc., for example. Also, the insulative adhesive layer may contain glass mat, inorganic filler, glass fabric or the like (prepreg).

For example, in case the above prepreg is used, it is interposed between the rigid and flexible substrates and hot-pressed to form the insulative adhesive layer.

In case the prepreg is used, the bump formed on the interconnecting electrode pad should preferably be formed molding a metal paste into a specified shape and then curing it. For accurate penetration in a specified position, the conductor lump should preferably have the free end thereof formed in a conical or pyramidic shape for easy penetration through the insulative adhesive layer. Alternatively, the shape may be hemispheric or trapezoidal.

The metal paste may be a conductive compound prepared by mixing a conductive powder of silver, gold, solder powder, carbon powder or the like, an alloy powder of them or a metal powder mixture of them, and a binder such as polycarbonate resin, polysulfon resin, polyester resin, phenoxy resin, melamine resin, phenol resin, polyimide resin or the like.

The metallic bump may be formed as a conductive bump having a high aspect ratio by printing using a relatively thick metal mask. The bump should preferably have a height about 1.3 times larger than the thickness of the insulative adhesive layer. For example, the bump height is set to 65 to 150 μm when the insulative adhesive layer is 50 μm thick.

EXAMPLE 1

(A) Preparation of a Flexible Substrate (1) For manufacturing the flex-rigid wiring board according to the present invention, a laminated film (ESPANEX SB by Shin-Nittetsu Chemicals) including a 25 μm-thick insulative film 11 of polyimide resin having an 18 μm-thick copper foil 12 laminated on either side thereof (as in FIG. 2(*a*)) was used as a base material for preparation of a flexible substrate 100A included in the flex-rigid wiring board.

(2) The copper foil 12 laminated on either side of the insulative film 11 was etched using a cupric chloride aqueous-solution to form patterns 13 and 250 μm-diameter interconnecting electrode pads 16. A photosensitive epoxy resin (FR-5538EA by Hitachi Chemical) was applied to the wiring pattern, dried at 80° C. for 3 hours, then exposed to ultraviolet rays, and developed using dimethyleneglycol diethylether to form a 25 μm-thick resin cover layer 14 which has 300 μm-diameter openings 15 formed therein and protects the patterns 13. See FIGS. 2(*b*) to 2(*d*).

(B) Preparation of a Rigid Substrate (1) Laser irradiating openings 24 were made, by etching with a cupric chloride aqueous-solution, in one side of a 0.11 mm double-sided copper-clad laminate (R-1766 by Matsushita Electric; (as in FIG. 3(*a*)) including a substrate 21 of glass epoxy resin having a 12 μm-thick copper foil 22 laminated on either side thereof, thereby forming laser irradiating openings 24, and further 250 μm-diameter openings 26 for filling copper plate were formed in the double-sided copper-clad laminate by irradiating carbon-dioxide laser. See FIGS. 3(*b*) and 3(*c*).

(2) Further, a Pd catalyst was applied to the inner wall of the opening (through-hole) 26, the inner wall was plated with copper by electroless plating with a plating solution and under conditions as will be given below, and then plated with electrolytic copper, to thereby fill a copper plate 28 in each of the openings 26. See FIG. 3(*d*).

| Electroless copper plating solution: | |
|---|---|
| Copper sulfate | 10 g/liter |
| HCHO | 8 g/liter |
| NaOH | 5 g/liter |
| Rochelle salt | 45 g/liter |
| Temperature | 30° C. |
| Electrolytic copper plating solution: | |
| Sulfuric acid | 180 g/liter |
| Copper sulfate | 80 g/liter |
| CAPARACID GL (by ATOTEK Japan) | 1 ml/liter |

| Plating conditions: | |
|---|---|
| Current density | 2 A/dm$^2$ |
| Time | 30 min |
| Temperature | 25° C. |

(3) Both sides of the substrate with the copper plate 28 filled in the openings 26 were etched using the cupric chloride aqueous-solution to form patterns 32 and 34 in the front and rear sides of the substrate, and a part of the pattern 34 was formed into an interconnecting electrode pad 36. Further, the substrate was processed using a rooter (as in FIG. 3(*e*)).

(4) Next, conical projections 40, namely, solder bumps, were formed on the interconnecting electrode pads 36 by filling a silver paste (SOLAMET by DUPONT) into a metal mask having a conical opening formed therein with the use of a squeegee. Further, the conical projections 40 were cured by heating at 150° C. for one hour to form a rigid substrate 200A. See FIG. 3(*f*).

(C) Stacking of the Substrates (1) The conical projection 40 on the rigid substrate 200A prepared in the above process (B) was pierced by a prepreg 42 (GIA-671N by Hitachi Chemical) under a pressure of 10 kg/cm$^2$. See FIG. 4(*a*).

Figure 4A:
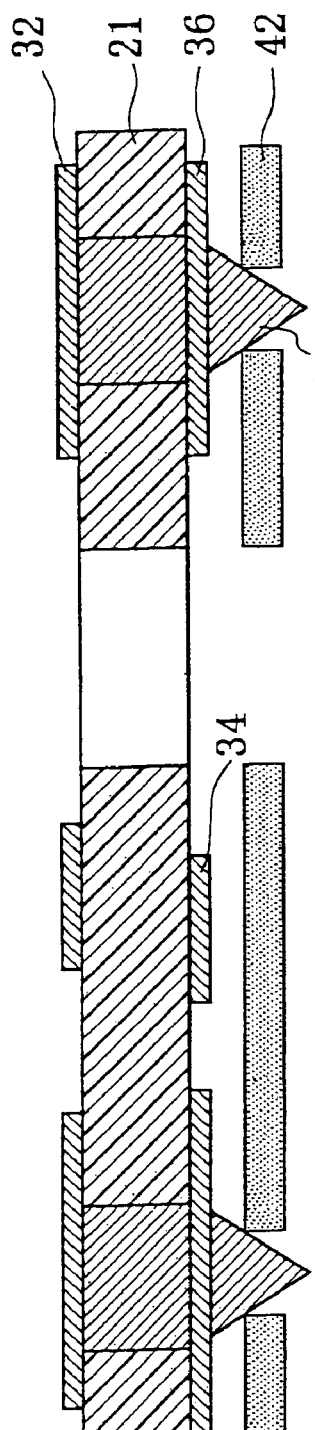
FIGS. 4(a) and 4(b) show yet other steps of the process of manufacturing a flex-rigid wiring board according to the first example of the present invention.
Figure 4B:
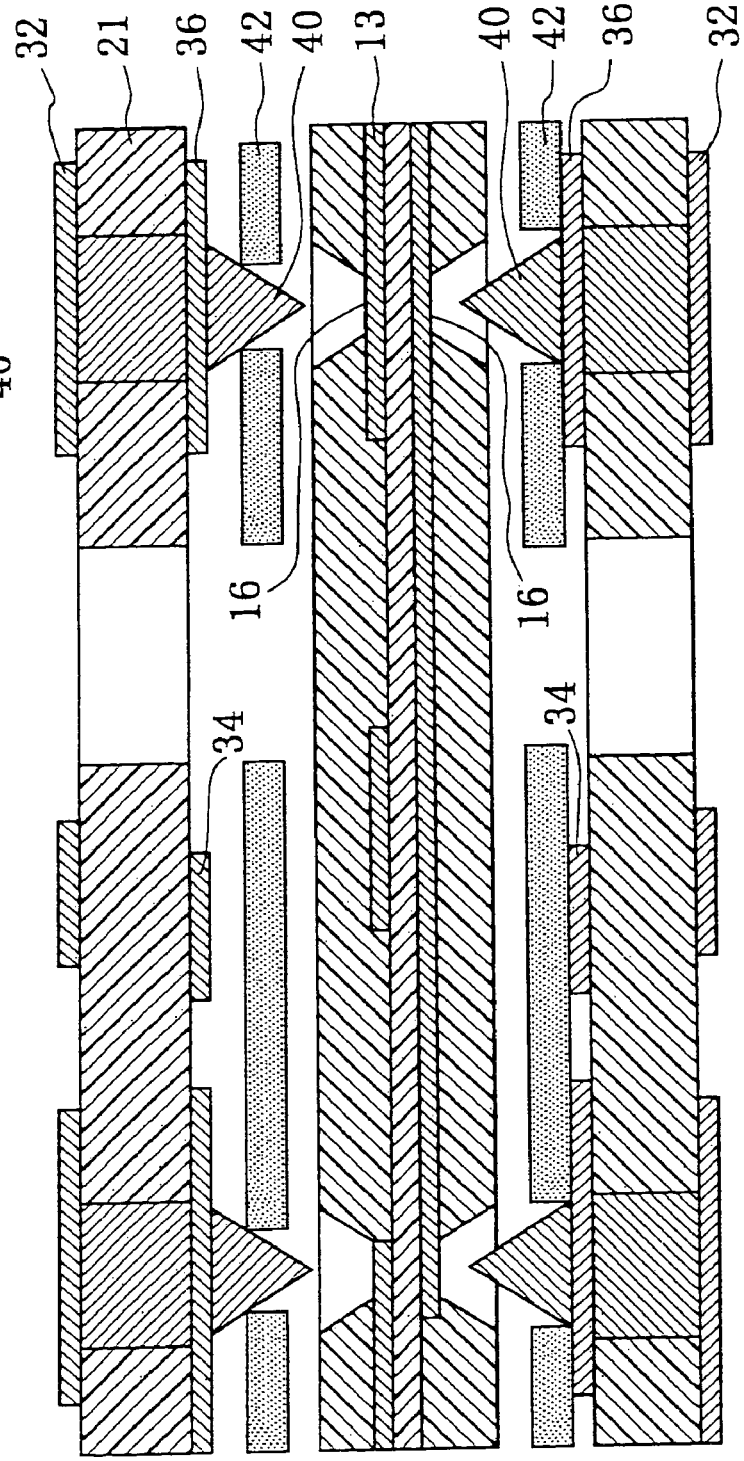
Figure 5:
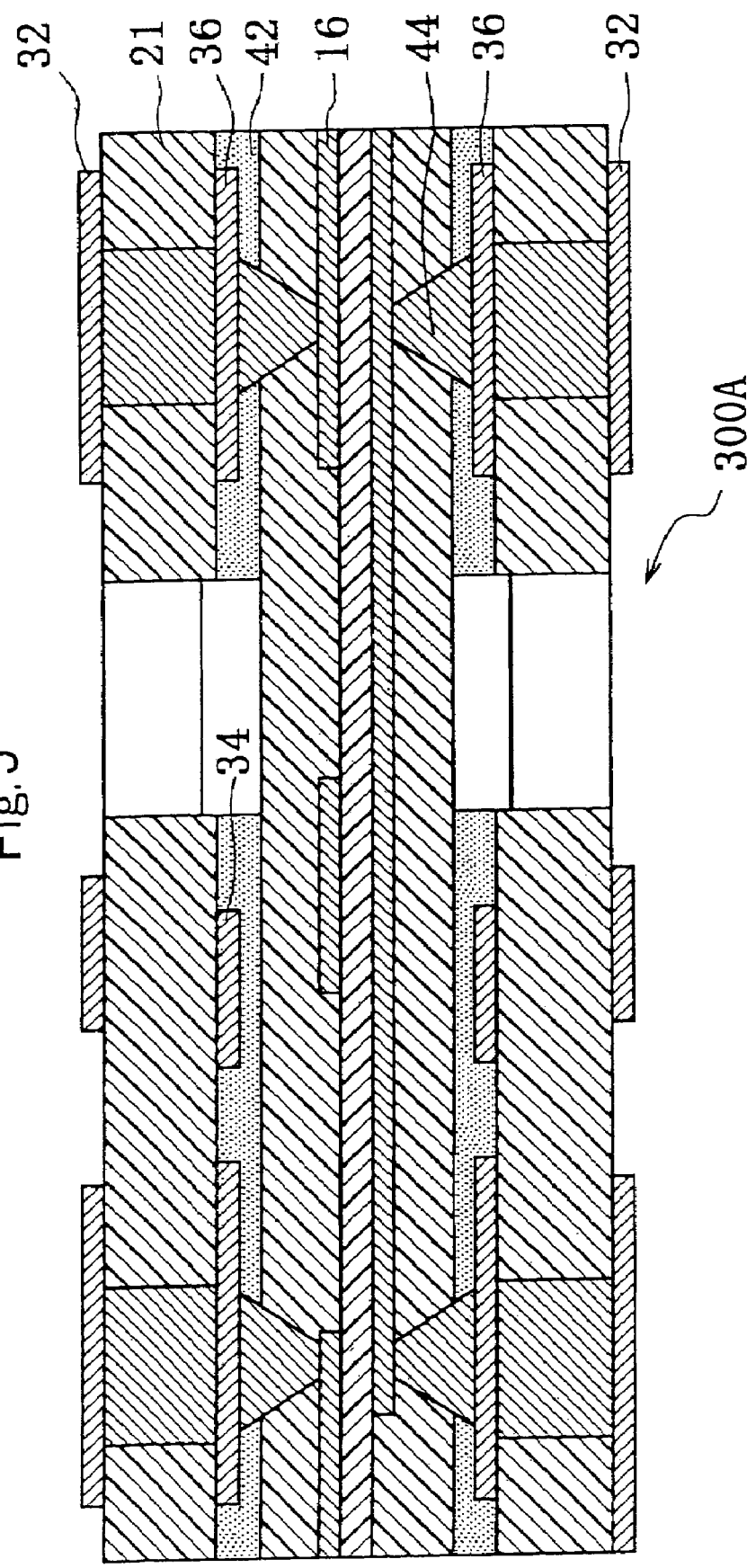
FIG. 5 shows the flex-rigid wiring board according to the first example of the present invention.

(2) Next, the flexible substrate 100A prepared in the above process (A) and the rigid substrate 200A were stacked one on the other and hot-pressed at 180° C. with a pressure of 40 kg/cm$^2$ (as in FIG. 4(*b*)) to provide a flex-rigid wiring board 300A in which the flexible and rigid substrates 100A and 200A were connected to each other through a conductor lump 44 as shown in FIG. 5.

Note that since the area $S_1$ of contact between the conductor lump 44 and the interconnecting electrode pad 16 on the flexible substrate 100A was $3.92 \times 10^{-2}$ mm$^2$ and the area $S_0$ of the interconnecting electrode pad was $4.9 \times 10^{-2}$ mm$^2$, the ratio $S_1/S_0$ was 0.8.

EXAMPLE 2

A) Preparation of a Flexible Substrate (1) For manufacturing the flex-rigid wiring board according to the present invention, a laminated film (ESPANEX SB by Shin-Nittetsu Chemicals) including a 25 μm-thick insulative film 11 of polyimide resin having an 18 μm-thick copper foil 12 laminated on either side thereof was used as a base material for preparation of a flexible substrate included in the flex-rigid wiring board.

(2) The copper foil 12 laminated on either side of the insulative film 11 was etched using a cupric chloride aqueous-solution to form patterns 13, and a cresol-novolak epoxy resin (by Nihon Kayaku) of 60% by weight solved in dimethylglycol dimethylether was applied to the patterns 13. The resin was dried at 80° C. for 3 hours to form an uncured epoxy resin layer 50 (adhesive layer). Thus, a flexible substrate 100B was prepared.

(B) Preparation of a Rigid Substrate (1) In a 0.11 mm-thick single-sided copper-clad laminate (as in FIG. 6(*a*)) including a substrate 21 of glass epoxy resin having a 12 μm-thick copper foil 22 laminated thereon, there were formed 150 μm-diameter openings 26 for filling copper plate with the use of a carbon dioxide laser (as in FIG. 6(*b*)).

(2) Further, a Pd catalyst was applied into the opening 26, and the inner wall was plated with copper by electroless plating to fill a copper plate 28 inside the opening 26. Also, projections 29 of 3 μm in height were formed on the surface of the substrate. See FIG. 6(*c*).

Note that the compositions of the electroless copper plate and electroplate were as in the example 1.

(3) Further, the surface of the projection 29 was plated with solder under the following conditions to form a solder layer 31 which covers the surfaces of the projections 29. See FIG. 6(*d*).

| Electrolytic solder plating solution: | |
|---|---|
| $Sn(BF_4)_2$ | 25 g/liter |
| $Pb(BF_4)_2$ | 12 g/liter |
| Plating conditions: | |
| Temperature | 20° C. |
| Current density | 0.4 $A/dm^2$ |

(4) The copper foil 22 attached to the one side of the single-sided copper-clad laminate was etched using the cupric chloride aqueous-solution to form conductor pattern 32. See FIG. 6(*e*).

(5) Further, the substrate was processed using a rooter to provide a rigid substrate 200B. See FIG. 7(*a*).

Figure 7A:
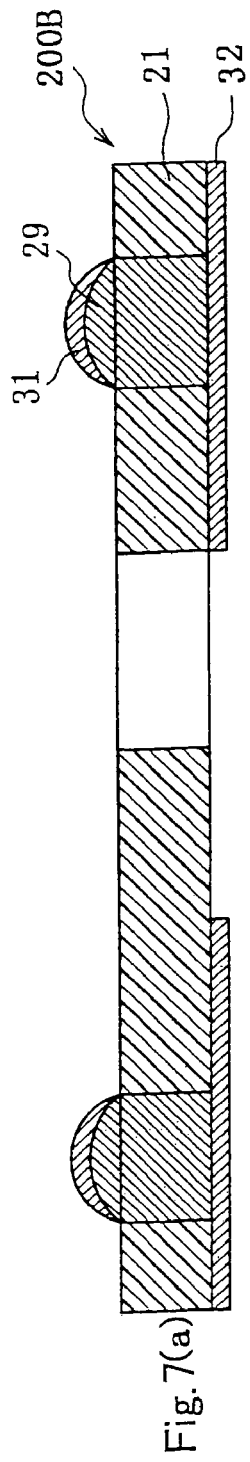
FIGS. 7(a) to 7(c) show still other steps of the process of manufacturing a flex-rigid wiring board according to the second example of the present invention.
Figure 7B:
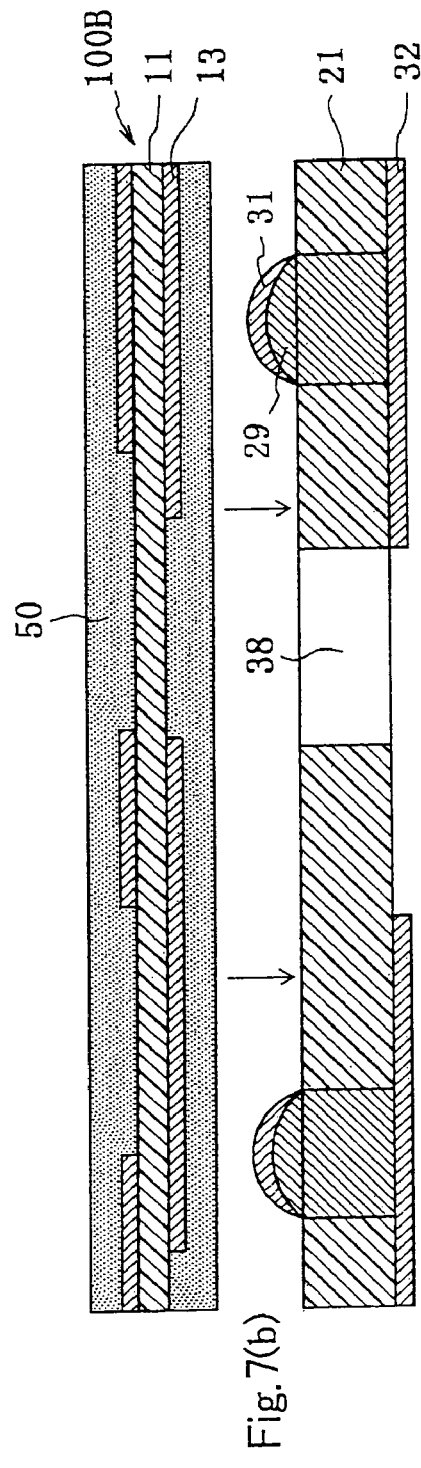
Figure 7C:
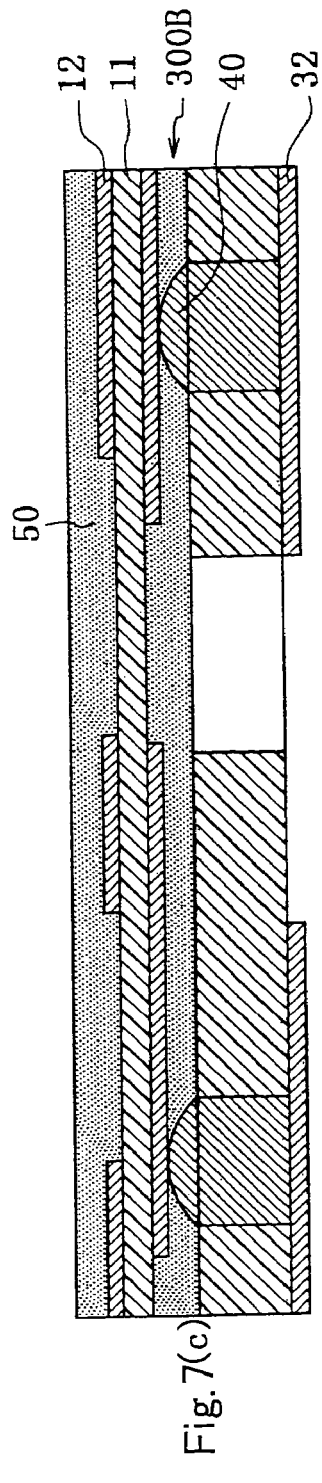

(C) Stacking of the Substrates (1) The flexible substrate 100B prepared in the above process (A) and the rigid substrate 200B prepared in the process (B) were stacked one on the other and hot-pressed at 180° C. with a pressure of 40 kg/cm² (as in FIG. 7(*b*)). Further, the stack was heated up to 200° C. to melt the solder, to thereby provide a flex-rigid wiring board 300B in which the flexible and rigid substrates 100B and 200B were joined to each other through the conductor lumps 40 each including the copper-plate projections 29 and solder layer (see FIG. 7(*c*)).

During the above hot-pressing, the projection 29 penetrated the uncured epoxy resin layer 50 of the flexible substrate 100B until it touched the rigid substrate 200B, and the solder layer 31 was melted by reflowing at 200° C. to implement the electrical connection between the flexible and rigid substrates 100B and 200B.

EXAMPLE 3

(A) Preparation of a Flexible Substrate (1) For manufacturing the flex-rigid wiring board according to the present invention, a laminated film (ESPANEX SB by Shin-Nittetsu Chemicals) including a 25 μm-thick insulative film 11 of polyimide resin having an 18 μm-thick copper foil 12 laminated on either side thereof was used as a base material for preparation of a flexible substrate included in the flex-rigid wiring board.

(2) The copper foil 12 laminated on either side of the insulative film 11 was etched using a cupric chloride aqueous-solution to form patterns 13, and a novolak epoxy resin (by Nihon Kayaku) of 60% by weight solved in dimethylglycol dimethylether was applied to the patterns 13. The resin was dried at 80° C. for 3 hours to form an uncured epoxy resin layer 50. Thus, a flexible substrate was prepared.

(B) Preparation of a Rigid Substrate (1) In a 0.11-mm single-sided copper-clad laminate (as in FIG. 6(*a*)) including a substrate 21 of glass epoxy resin having a 12 μm-thick copper foil 22 laminated thereon, there were formed 150 μm-diameter openings 26 for filling copper plate with the use of a carbon dioxide.

(2) Further, a Pd catalyst was applied into the opening 26, and the inner wall was plated with copper by electroless plating to fill a copper plate 28 inside the opening 26. Also, projections of 3 μm in height were formed on the surface of the substrate.

Note that the compositions of the electroless copper plate and electrolytic copper plate were as in the example 1.

(C) Preparation of Solder Balls

Figure 8:
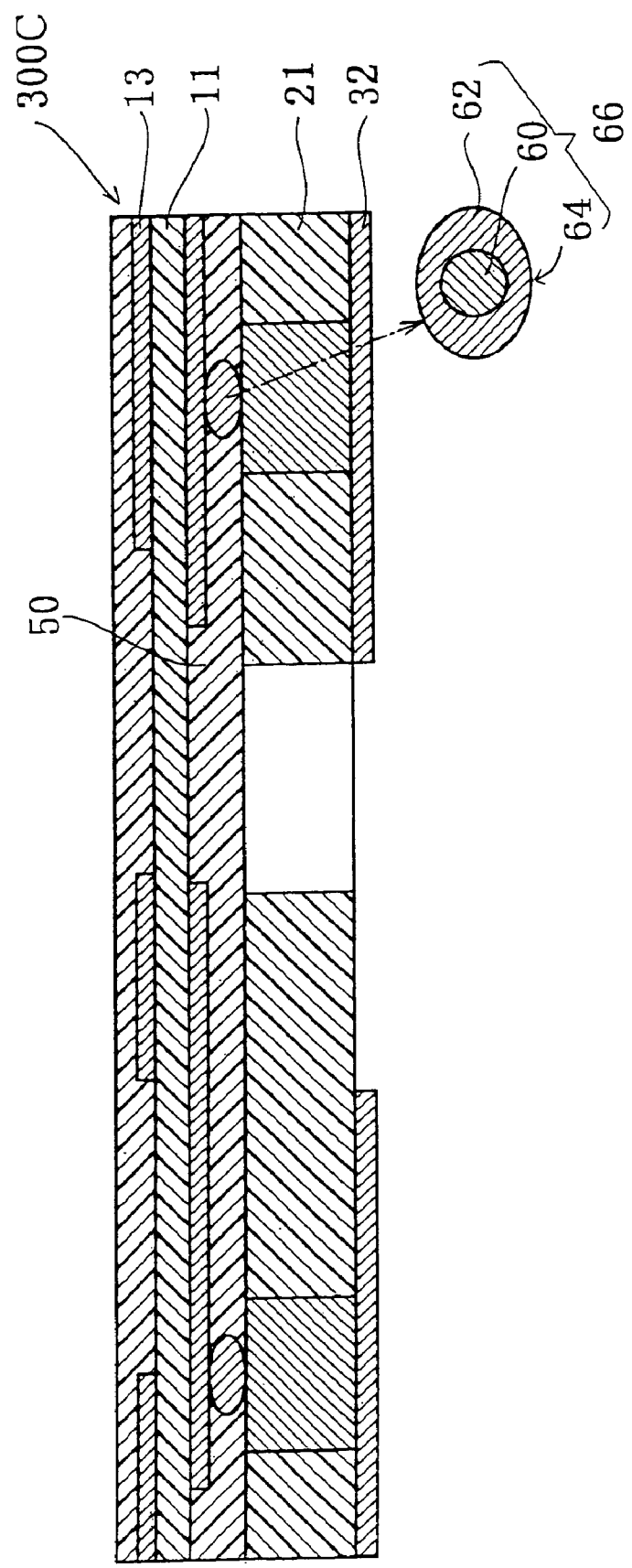
FIG. 8 shows a flex-rigid wiring board according to a third example of the present invention.

Copper balls 60 of 0.1 mm in diameter (by Mitsubishi Materials) were plated with electrolytic solder to a thickness of 60 μm to provide solder balls 64 each having a solder layer 62 formed on the surface thereof (as in FIG. 8). The electrolytic solder plating conditions were as in the example 1.

(C) Stacking of the Substrates

The flexible substrate prepared in the above process (A) and the rigid substrate prepared in the process (B) were stacked one on the other with the solder balls 64 being placed between them, hot-pressed at 180° C. with a pressure of 40 kg/cm², and further heated up to 200° C. to melt the solder. Thus, a flex-rigid wiring board 300C was formed in which the flexible and rigid substrates were joined to each other through the conductor lumps 66 as shown in FIG. 8.

During the above hot-pressing, the solder ball 64 penetrated the uncured epoxy resin layer 50 of the flexible substrate until it touched the rigid substrate, and the solder was melted by reflowing at 200° C. to implement the electrical connection between the flexible and rigid substrates.

In this example, since the copper balls 60 are not melted, they provide a function as a spacer to keep the substrates at a constant distance from each other.

EXAMPLE 4

(A) Preparation of a Flexible Substrate (1) For manufacturing the flex-rigid wiring board according to the present invention, a laminated film (ESPANEX SB by Shin-Nittetsu Chemicals) including a 25 μm-thick insulative film 11 of polyimide resin having an 18 μm-thick copper foil 12 laminated on either side thereof was used as a base material for preparation of a flexible substrate included in the flex-rigid wiring board.

(2) The copper foil 12 laminated on either side of the insulative film 11 was etched using a cupric chloride aqueous-solution to form patterns 13, and a photosensitive epoxy resin (FR-5538EA by Hitachi Chemical) was applied to the patterns, dried at 80° C. for 3 hours, then exposed to ultraviolet rays and developed in dimethylglycol dimethylether to form a resin cover layer 14 having a 300 μm-diameter opening 15 formed therein and having a thickness of 25 μm to protect the patterns 13. Further, a solder paste (by HERAUS) was screen-printed in the opening 15, and copper-made T-shaped pin 68 was mounted in the opening 15. The solder paste and T-shaped pin 68 were reflowed at 200° C. to provide a flexible substrate.

(B) Preparation of a Rigid Substrate Having a Through-Hole Formed Therein (1) A 0.11 mm-thick single-sided copper-clad laminate, including a substrate 21 of glass epoxy resin having a 12 μm-thick copper foil 22 laminated thereon, was drilled to form through-holes 69. The through-hole wall was plated with electroless copper and electrolytic copper.

Next, the laminate was etched using a cupric chloride aqueous-solution to form a conductor pattern 70.

(2) Further, the laminate was cut using a rooter to provide a rigid substrate having the through-holes 69 formed therein.

(C) Preparation of an Adhesive Film

An epoxy resin solution was applied to a polyethylene terephthalate film, and dried at 80° C. for one hour to provide an adhesive film.

(D) Stacking of the Substrates

Figure 9:
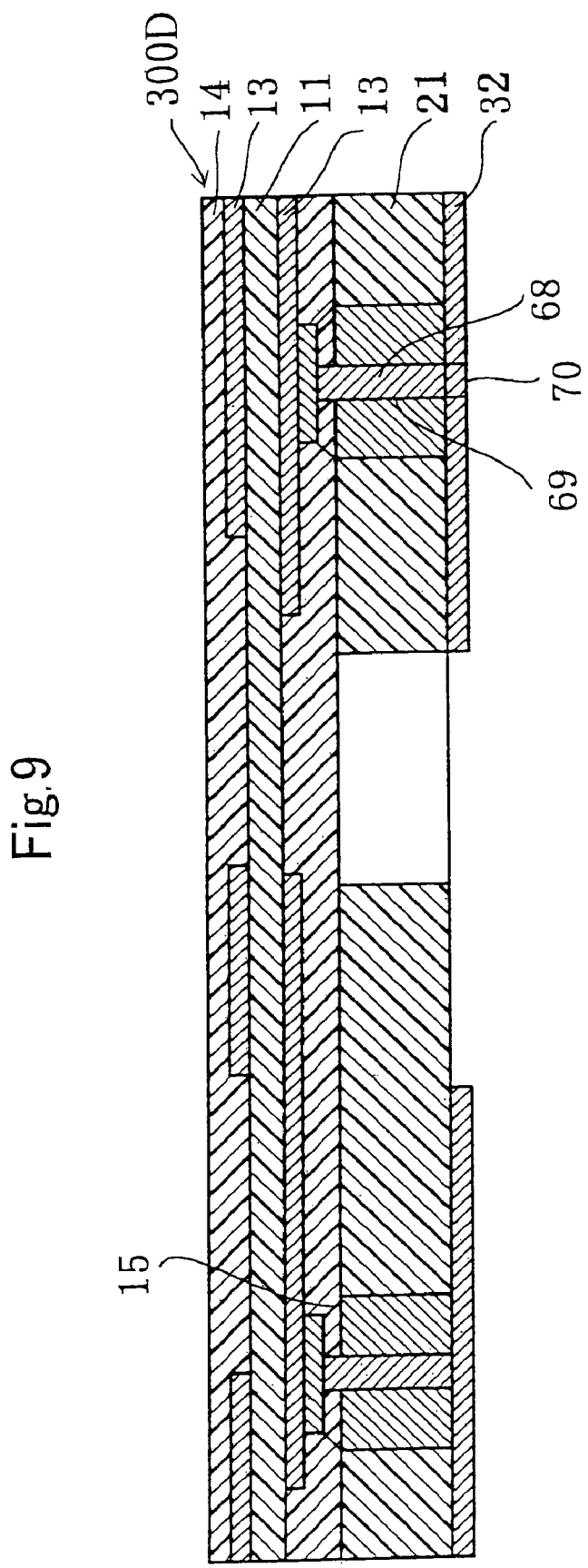
FIG. 9 shows a flex-rigid wiring board according to a fourth example of the present invention.

A solder paste was applied, by screen printing, to the through-hole 69 in the rigid substrate prepared in the process (B), the adhesive film prepared in the above process (C) was pierced into the T-shaped pin 68 in the flexible substrate prepared in the process (A), and the rigid and flexible substrates were stacked one on the other, hot-pressed at 180° C. with a pressure of 40 kg/cm$^2$ and further reflowed at 200° C. to provide a flex-rigid wiring board 300D as shown in FIG. 9.

EXAMPLE 5

This example 5 is basically the same as the example 2 provided that a flexible substrate 100E was held tight between two rigid substrates 200E, upper and lower, a via-hole 72 as an interlayer connection of the flexible substrate 100E and via-hole 71 as an interlayer connection of the rigid substrates 200E were aligned with each other. Thus, a flex-rigid wiring board 300E was manufactured which has a so-called stack structure 73. See FIG. 10.

EXAMPLE 6

(A) Preparation of a Flexible Substrate (1) For manufacturing the flex-rigid wiring board according to the present invention, a laminated film (ESPANEX SB by Shin-Nittetsu Chemicals) including a 25 μm-thick insulative film 11 of polyimide resin having an 18 μm-thick copper foil 12 laminated on either side thereof was used as a base material for preparation of a flexible substrate 100F included in the flex-rigid wiring board. See FIG. 2(a).

(2) The insulative film 11 having the copper foil 12 laminated on either side thereof was etched using a cupric chloride aqueous-solution to form patterns 13 and 250 μm-diameter interconnecting electrode pads 16, and a photosensitive epoxy resin (FR-5538EA by Hitachi Chemical) was applied to the patterns, dried at 80° C. for 3 hours, then exposed to ultraviolet rays and developed in dimethylglycol dimethylether to form a resin cover layer 14 having a 300 μm-diameter opening 15 formed therein and having a thickness of 25 μm to protect the patterns. See FIGS. 2(b) to 2(d).

(B) Preparation of a Rigid Substrate (1) In a 0.11 mm-thick double-sided copper-clad laminate (R-1766 by Matsushita Electric), including a substrate 21 of glass epoxy resin having a 12 μm-thick copper foil 22 laminated thereon, laser irradiation openings 24 were formed, using a cupric chloride aqueous-solution, and 200 μm-diameter copper plate filling openings 26 were formed by irradiating a carbon dioxide laser. See FIG. 6(b).

(2) Further, a Pd catalyst was applied into the opening 26, and the inner wall was plated with copper by electroless plating and further by electrolytic plating to fill a copper plate 28 inside the opening 26. See FIG. 6(c).

(3) Both sides of the substrate having the copper plate 28 filled in the openings 26 were etched using a cupric chloride aqueous-solution to form patterns 32 and 34 in the front and rear sides, respectively, and a part of the pattern 34 was formed as an interconnecting electrode pad 36. Further, the substrate was processed using a rooter.

(4) Next, a solder foil was attached to a polyethylene terephthalate film 80, and etched with 1 N sulfuric acid aqueous-solution to form a film sheet having a circular-patterned solder layer 82 in a specified place.

(5) The film sheet having the solder layer 82 was stacked on the substrate processed by the rooter in the step (3) (as in FIG. 11(a)) and reflowed at 200° C. to form a solder bump 84 (as in FIG. 11(b)).

(6) An epoxy resin solution was applied to the polyethylene terephthalate film, and dried at 80° C. for one hour to provide an adhesive film 86.

Figure 12:
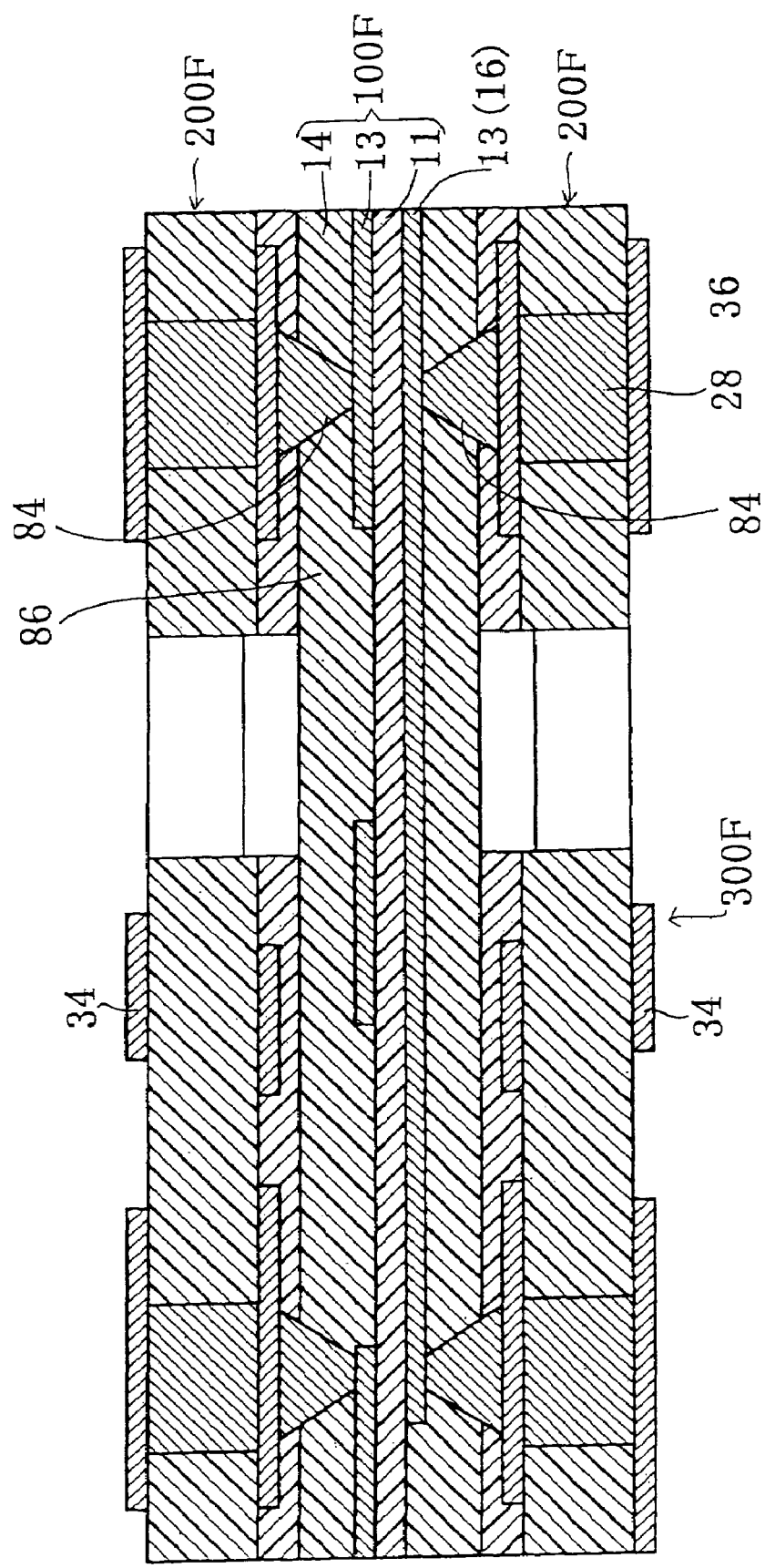
FIG. 12 shows a flex-rigid wiring board according to the sixth example of the present invention.

(C) Stacking of the Substrates (1) The flexible substrate 100F prepared in the above process (A) and the rigid substrate 200F prepared in the process (B) were stacked one on the other with the adhesive film 86 being laid between them (as in FIG. 11(c)), hot-pressed at 180° C. with a pressure of 40 kg/cm$^2$, and further reflowed at 200° C. to provide a flex-rigid wiring board 300F as shown in FIG. 12.

EXAMPLE 7

(A) Preparation of a Flexible Substrate

A flexible substrate was prepared as in the steps (1) and (2) in the process (A) for the example 6.

(B) Preparation of a Rigid Substrate (1) For implanting, there was used a clad material including a 0.11 mm-thick copper foil 93 having a 60 μm-thick solder layer 94 stacked thereon.

Figure 13:
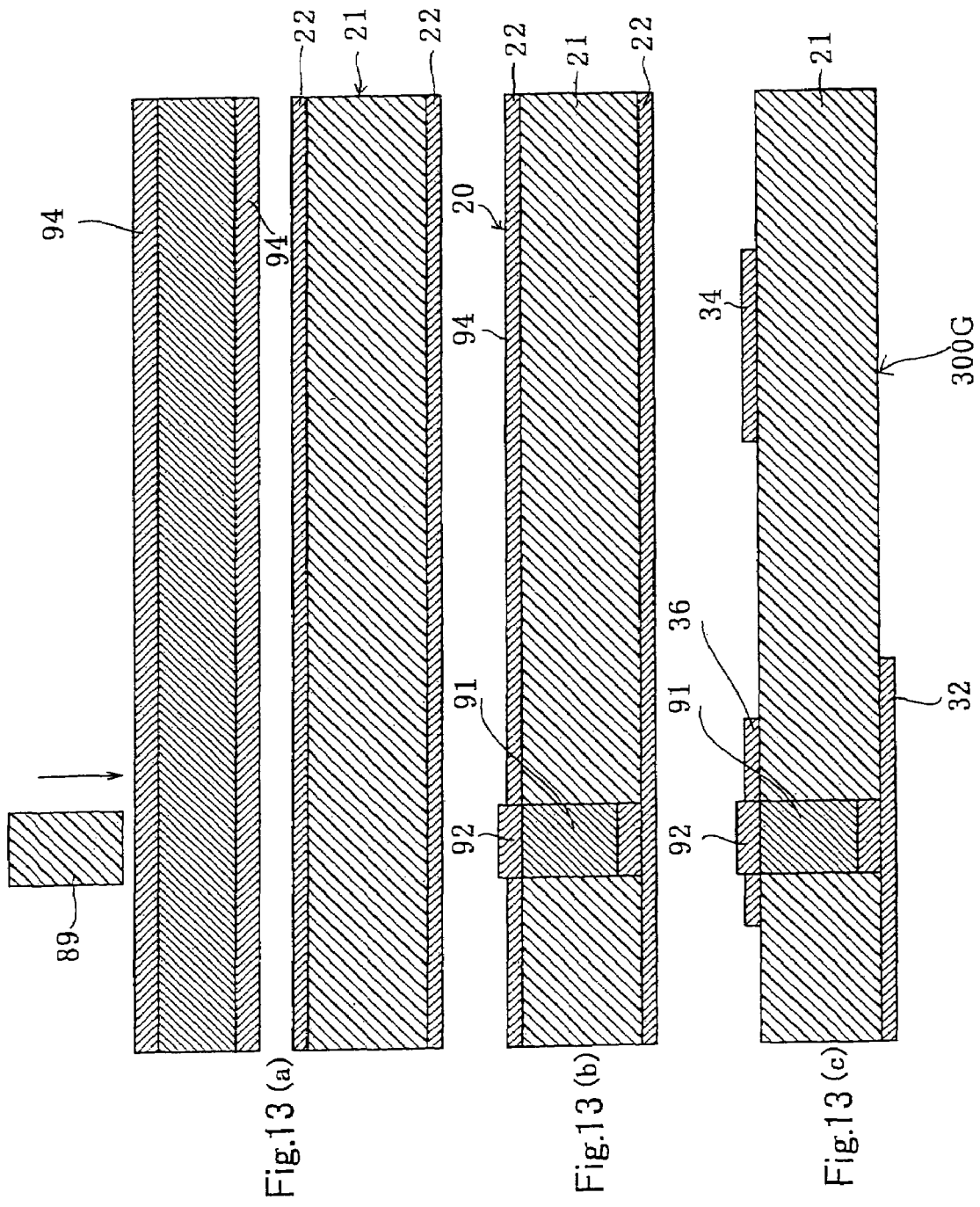
FIGS. 13(a) to 13(c) show some steps of a process of manufacturing a flex-rigid wiring board according to a seventh example of the present invention.

(2) The clad material was mounted on a 0.11 mm-thick copper-clad laminate 20 including a substrate 21 of glass epoxy resin having an 18 μm-thick copper foil 22 laminated on either side thereof, punched by a punch 89 with a pressure of 100 kg/cm$^2$ to form a copper-solder post 91. The post 91 was buried in the copper-clad laminate 20 (as in FIGS. 13(a) to 13(c)) to provide a rigid substrate 200G.

Note that the copper-solder post 91 had a solder portion 92 projecting 84 μm (120-36 μm) from the copper-clad laminate 20. The projection 92 functions as a bump.

(C) Stacking of the Substrates

The flexible substrate prepared in the above process (A) and the rigid substrate 200G prepared in the process (B) were stacked one on the other with an adhesive film 86 being placed between them as in the example 6, hot-pressed at 180° C. with a pressure of 40 kg/cm$^2$, and further reflowed at 200° C. to provide a flex-rigid wiring board.

EXAMPLE 8

As in the example 1, by changing the area ratio $S_1/S_0$, where $S_0$ is the area of the interconnecting electrode pad which is smaller in area of contact with the conductor lump and $S_1$ is the area of contact between the interconnecting electrode pad and conductor lump, stepwise from 0.05 to 1.0, there was produced a plurality of flex-rigid wiring boards different in area ratio $S_1/S_0$ from each other.

EXAMPLE 9

This example is generally similar to the example 1 provided that there was produced a plurality of flex-rigid printed multilayer wiring boards whose range of overlapping between the rigid substrate 200A and flexible substrate 100A is varied in 13 steps: 3%, 5%, 10%, 15%, 20%, 25%, 30%, 40%, 45%, 50%, 60%, 80% and 100% of the surface area of the rigid substrate 200A.

COMPARATIVE EXAMPLE 1

Figure 14:
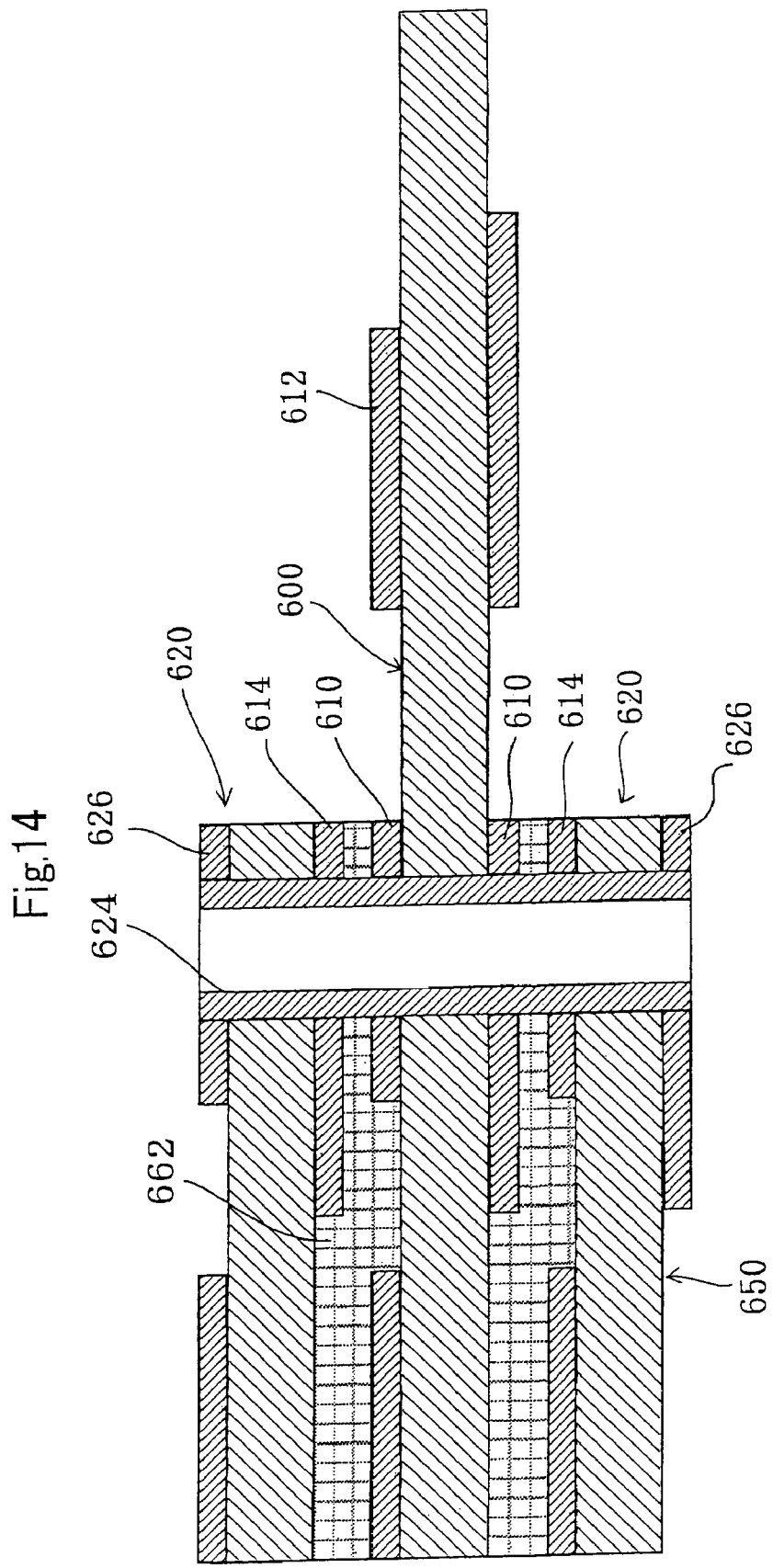
FIG. 14 illustrates a flex-rigid wiring board as a comparative example 1.

(1) As shown in FIG. 14, an internal-layer circuit 610 and an electrical circuit 612 corresponding to a flexible portion were formed on a flexible substrate by the subtractive process. Next, a punched coverlay film was aligned and provisionally attached to the electrical circuit, and then the stack was hot-pressed by a multiplaten press to provide an internal-layer circuit substrate and flexible substrate 600 which will be the flexible portion.

(2) Another inner-layer circuit 614 was formed on one side of a glass epoxy double-sided copper-clad laminate by the subtractive process. Next, the stack was contoured to form a rigid substrate 620 as one conductive layer of a multilayer rigid portion.

(3) The flexible substrate 600 and a plurality of rigid substrates 620, formed in the above steps (1) and (2), respectively, were stacked and secured one on the other through a prepreg 622, and joined to each other by hot-pressing.

Next, by making electroless plating of holes formed in the substrate, the inner-layer circuit 610 and inner-layer circuit 614 were connected electrically to each other through a plated through-hole 624, and an electrical circuit 626 was formed on the other side of the rigid portion, to thereby provide a flex-rigid wiring board 650.

COMPARATIVE EXAMPLE 2

This example is similar to the example 2 except that no uncured epoxy resin layer (adhesive layer) was formed and the flexible and rigid substrates were connected to each other only with the adhesion of solder.

COMPARATIVE EXAMPLE 3

(1) For manufacturing a flex-rigid wiring board as the comparative example 3, a laminated film (ESPANEX SB by Shin-Nittetsu Chemicals) including a 25 μm-thick insulative film 700 of polyimide resin having a 18 μm-thick copper foil laminated on either side thereof was used as a base for a flexible substrate included in the flex-rigid wiring board.

(2) The copper foil laminated on either side of the insulative film 700 was etched with a cupric chloride aqueous-solution to form an electrical circuit 714.

(3) Twelve parts by weight of epoxy-resin fine powder (by TORAY) were mixed in 100 parts by weight of the solid content of a photosensitive polyimide resin (by Hitachi Chemical), the mixture was conditioned in a disperser to a viscosity of 5000 cp while N-methylpirrolidone solvent was being added to the mixture, and then kneaded by three rolls to provide an adhesive solution for a photosensitive resin insulative layer.

(4) Next, a coverlay film was laminated on the insulative film 700 having the electrical circuit 714 formed thereon, applied with the adhesive solution for the photosensitive insulative layer by a spinner (at 1000 rpm), left horizontally at room temperature for 60 min, and dried at 80° C. for 10 min to provide a 60 μm-thick photosensitive resin insulative layer 716.

(5) Then, photoresist masks were formed over places where via-holes were to be formed and flexible portion, and the substrate was exposed to a very high pressure mercury lamp for 30 sec. The substrate was developed for 1 min in an N-methylpirrolidone methanol kneading solution (3:1) to form inter-conductor connecting via-holes. Thereafter, the substrate was exposed to the very high pressure mercury lamp for 5 min, and heated at 200° C. for 30 min to completely cure the photosensitive resin insulative layer.

(6) The substrate formed in the above step (5) was immersed in an oxidizer comprising 800 g/l of chromic acid solution ($CrO_3$) at 60° C. for 2 min to rough the surface of the resin insulative layer 716, and then immersed in a neutralizer solution (by SIPLAY) for rinsing.

(7) The substrate having the surface of the resin insulative layer 716 roughed as above was applied with palladium (by SIPLAY) to activate the surface, and then applied with a liquid photoresist, and immersed in an electroless copper plate solution as an additive for 10 hours to form a via-hole 720 formed from a 25 μm-thick electroless copper plate layer.

(8) Next, the substrate was applied with the adhesive prepared in the step (3) and then the steps (4) to (7) were repeated 3 times.

Figure 15:
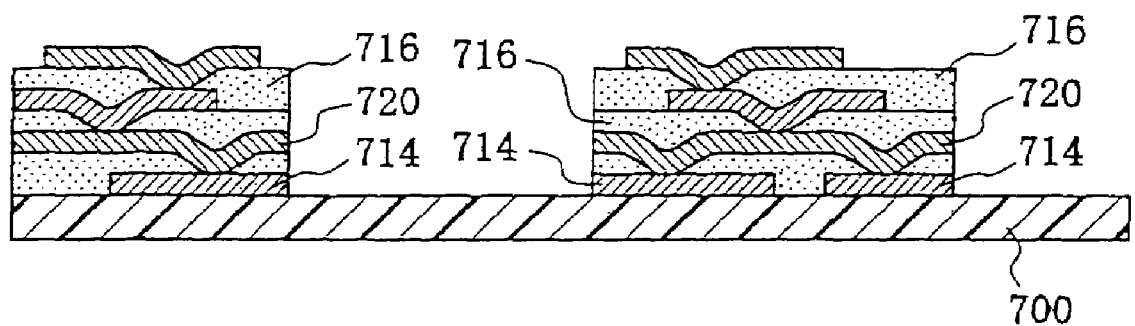
FIG. 15 illustrates a flex-rigid wiring board as a comparative example 3.

(9) Finally, the liquid photoresist applied in the step (7) was removed to provide a four-layer flex-rigid wiring board (as in FIG. 15).

The examples 1 to 9 and comparative examples 1 to 3, having been explained in the foregoing, were tested as will be described below.

(1) Cooling/Heating Cycle Test 1

Each of the examples 1 to 7 and comparative examples 1 to 3 were left at −65° C. for 15 min, and then at 125° C. for 15 min. The cooling/heating was repeated 1250 times to check the electrical continuity at the connection between the flexible and rigid substrates. The results are shown in Table 1. In Table 1, "o" indicates that there was found the electrical continuity at the connection and "x" indicates that there was found no electrical continuity.

TABLE 1

| | No. of cooling/heating repetitions (in times) | | | | | | |
|---|---|---|---|---|---|---|---|
| | 100 | 200 | 300 | 400 | 500 | 1000 | 1250 |
| Example 1 | o | o | o | o | o | o | o |
| Example 2 | o | o | o | o | o | o | o |
| Example 3 | o | o | o | o | o | o | o |
| Example 4 | o | o | o | o | o | o | o |
| Example 5 | o | o | o | o | o | o | o |
| Example 6 | o | o | o | o | o | o | o |
| Example 7 | o | o | o | o | o | o | o |
| Comparative example 1 (TH) | o | o | o | X | X | X | X |
| Comparative example 2 (only conductor lump) | o | o | X | X | X | X | X |
| Comparative example 3 (via-hole) | o | o | o | X | X | X | X |

Test method: JIS 5012 (Weatherability test)
Cycle: −65° C. to +125° C.

(2) Cooling/Heating Cycle Test 2

The flex-rigid wiring board as the example 8 was left at −65° C. for 15 min, and then at 125° C. for 15 min. The cooling/heating was repeated until no electrical continuity was found at the connection between the flexible and rigid substrates. The number of times the test had been repeated until no electrical continuity was found is shown in FIG. 19.

(3) Cooling/Heating Cycle Test 3

The flex-rigid wiring board as the example 9 was left at −65° C. for 15 min, and then at 125° C. for 15 min. The cooling/heating was repeated 2500 times to check the electrical continuity at the connection between the flexible and rigid substrates. The results are shown in Table 2.

In Table 2, "o" indicates that the electrical continuity was found at the connection, "x" indicates that no electrical continuity was found at the connection, and "Δ" indicates that the resistance variation rate exceeded 10%.

Note that the flex-rigid wiring board, which maintained the electrical continuity even after the cooling/heating was repeated 1500 times in the above cooling/heating cycle tests 1 to 3, was taken as a standard one.

(4) Tensile Strength Test

The flex-rigid wiring board as the example 9 was subjected to a tensile strength test for evaluation of the adhesion between the flexible and rigid substrates. In this test, one end of the flexible substrate was pulled with one end of the rigid substrate being fixed to a spring balancer, and the scale of the balancer was read when the flexible substrate started leaving the rigid substrate. This measurement was repeated 3 times, and the three results were averaged (in Kgf).

Table 2 also shows the results of measurements made on the different flex-rigid wiring boards in which the range of overlapping between the rigid and flexible substrates was varied stepwise.

Note that the flex-rigid wiring board, which showed a mean value of the tensile strength of 0.8 Kgf in the above tensile strength test, was taken as a standard one.

TABLE 2

| Overlapping range | No. of cooling/heating repetitions (in times) | | | | | Tensile strength |
|---|---|---|---|---|---|---|
| (in %) | 1250 | 1500 | 1750 | 2000 | 2500 | (in Kgf) |
| 3 | ○ | ○ | ○ | ○ | Δ | 0.75 |
| 5 | ○ | ○ | ○ | ○ | Δ | 0.91 |
| 10 | ○ | ○ | ○ | ○ | ○ | 1.02 |
| 15 | ○ | ○ | ○ | ○ | ○ | 1.09 |
| 20 | ○ | ○ | ○ | ○ | ○ | 1.12 |
| 25 | ○ | ○ | ○ | ○ | ○ | 1.19 |
| 30 | ○ | ○ | ○ | ○ | Δ | 1.21 |
| 35 | ○ | ○ | ○ | ○ | Δ | 1.25 |
| 40 | ○ | ○ | ○ | ○ | Δ | 1.29 |
| 45 | ○ | Δ | Δ | X | X | 1.32 |
| 50 | ○ | Δ | X | X | X | 1.35 |
| 60 | ○ | Δ | X | X | X | 1.39 |
| 80 | ○ | Δ | X | X | X | 1.40 |
| 100 | ○ | Δ | X | X | X | 1.42 |

(5) Inductance Measurement

Concerning the examples 1 to 5 and 7 and comparative examples 1 and 3, the dependence upon frequency of the inductance between the interconnecting electrode pads was measured using a network analyzer (E8357A by Agilent Technologies).

(6) Waveform Measurement

Variation in waveform of the pulse voltage between the interconnecting electrode pads was measured using a waveform generator (AWG710 by Tektronix) and digital sampling oscilloscope (11801B by Tektronix) in combination.

It will be understood from the above test results that the flex-rigid wiring board using only the conductor lumps cannot satisfactorily withstand the cooling/heating cycle. It can be estimated that the low resistance to the cooling/heating cycle comes from the large coefficient of thermal expansion of the flexible substrate and also from the small coefficient of thermal expansion of the rigid substrate.

Adopting the insulative adhesive, the present invention reduces the difference in coefficient of thermal expansion between the flexible and rigid substrates. As a result, the flex-rigid wiring board according to the present invention has an improved resistance to the cooling/heating cycle.

Further, the results of the test made on the example 8 (shown in FIG. 19) revealed that since the conductor lump is formed conical, when the area ratio is within $0.4 \leq S_1/S_0 \leq 0.9$ where $S_0$ is the area of the interconnecting electrode pad on the flexible substrate, the interconnecting electrode pad having a smaller area of contact with the conductor lump, and $S_1$ is the area of contact between the interconnecting electrode pad and conductor lump, the flex-rigid wiring board according to the present invention is highly durable against the cooling/heating cycle.

With the area ratio $S_1/S_0$ of less than 0.4, the contact area is so small that the conductor lump and interconnecting electrode pad will separate from each other. If the area ratio $S_1/S_0$ is larger than 0.9, the ratio of the conductor lump in the adhesive layer is too large and thus the stress caused by the expansion by heating and shrinkage by cooling will increase, resulting in the separation between the conductor lump and interconnecting electrode pad.

As will be known from the results of the test made on the example 9, if the range of overlapping between the rigid and flexible substrates is less than 40% of the surface area of the rigid substrate, the electrical continuity between the substrates can be maintained even of the cooling/heating cycle has been repeated more than 1500 times.

Also, the test results revealed that with the range of overlapping between the rigid and flexible substrates being within a range of 5 to 40% of the surface area of the rigid substrate, the standards for the cooling/heating cycle tests and tensile strength test were attained. Namely, it was found the flex-rigid wiring board according to the present invention has an improved electrical connection and reliability.

Further, the test results revealed that when the range of overlapping between the rigid and flexible substrates was within the range of 5 to 40%, the electrical continuity could be maintained between the substrates without any electrical disconnection between them even if the cooling/heating cycle was repeated more than 2000 times. Especially when the overlapping range was within a range of 10 to 25%, the electrical continuity could be maintained between the rigid and flexible substrates even if the cooling/heating cycle was repeated 2500 times. This range of overlapping was ascertained to be optimum.

As will be known from FIG. 16, the test results also revealed that in case the flexible and rigid substrates are connected to each other through the conductor lump as in the present invention, the inductance in a high-frequency band is lower than in case the substrates are connected to each other through a through-hole or via-hole.

When the inductance is lower, signal waveform will not easily be disturbed by any reflected wave and thus will not contain noise component.

That is, in case the flexible and rigid substrates are connected to each other through the conductor limp as in the present invention, there is less noise component in the high-frequency band than in case the substrates are connected to each other through the through-hole or via-hole.

The following will account for the above. Generally, in a higher-frequency band, the skin effect will work more to provide a higher current density in a place nearer to the surface of a conductor. Thus, in case the substrates are connected to each other through the through-hole or via-hole, the current will flow to the surfaces, front and rear, of a conductor. However, in case the substrates are connected to each other through the conductor lump, the current will only flow on the surface the conductor lump. Thus, the current will flow in a reduced amount, and the field strength depending upon the amount of current will also be lower. Therefore, the inductance depending upon the field strength will be lower.

Figure 18:
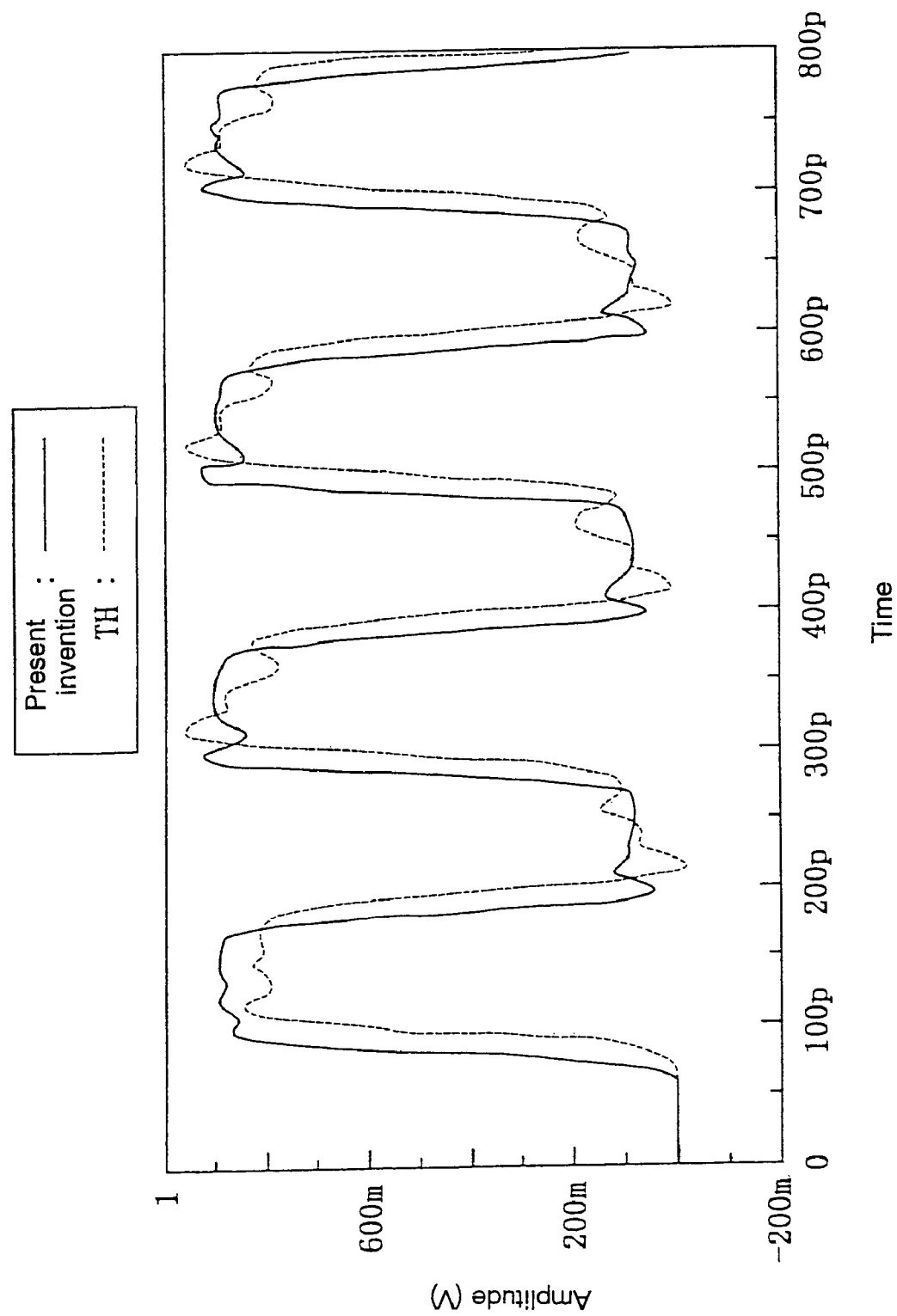
FIG. 18 illustrates a voltage waveform indicating a waveform disturbed by a reflection signal-caused noise, showing occurrence, above and below the waveform of a voltage in the connection structure according to the present invention, of a reflection noise-caused ringing of the waveform of a voltage in the conventional through-hole connection structure.

FIG. 18 shows influence of the interference by the reflected wave. As will be known from FIG. 18, the connection between the rigid and flexible substrates through the conductor lump as in the present invention will result in less distortion of the waveform due to the interference by the reflected wave than the connection through the through-hole or via-hole.

INDUSTRIAL APPLICABILITY

As having been described in the foregoing, the flex-rigid wiring board according to the present invention can implement the reduction of inductance in the high-frequency band, reduction of signal-delay time, reduction of noise generation due to the signal reflected-wave, and reduction of drop impact, and has a high connection reliability and high freedom of wire connection, and can advantageously be manufactured with a reduced cost and a high yield.

The invention claimed is:

1. A flex-rigid wiring board comprising:
a rigid substrate having a conductive layer including an interconnecting electrode pad;
a flexible substrate having a conductive layer including an interconnecting electrode pad, the flexible substrate being lap-joined and electrically connected to the rigid substrate; and
an insulative adhesive interposed between portions of the rigid and flexible substrates and lap-joining the rigid substrate and the flexible substrate such that the flexible substrate provides a flexible portion,
wherein the interconnecting electrode pads on the rigid and flexible substrates are electrically connected to each other through a conductor lump penetrating the insulative adhesive, one of the interconnecting electrode pads on the rigid and flexible substrates has an area of contact with the conductor lump which is smaller and which has an area So, the conductor lump and the one of the interconnecting electrode pads on the rigid and flexible substrates from an area of contact S1, and the area So and the area of contact S1 have a ratio S1/So which is $0.4 \leq S1/So \leq 0.9$.

2. The flex-rigid wiring board according to claim 1, wherein the conductor lump is a bulk conductor having the shape of a convex-curve, spherical or hemispheric, a column, prismatic or cylindrical, a cone, pyramidic or circular, or a pin.

3. The flex-rigid wiring board according to claim 1, wherein the conductor lump is a bump formed from a copper plate or an Sn—Ag solder plate.

4. The flex-rigid wiring board according to claim 2, wherein the conductor lump is connected through a solder layer to the interconnecting electrode pad provided on the flexible or rigid substrate.

5. The flex-rigid wiring board according to claim 1, wherein the conductor lump is a pin-shaped conductor lump fitted into the interconnecting electrode pads having through-hole-shaped interconnecting electrode pads provided on the rigid and flexible substrates, respectively.

6. The flex-rigid wiring board according to claim 1, wherein the rigid substrate comprises an insulative resin base comprising a prepreg.

7. The flex-rigid wiring board according to claim 6, wherein the prepreg comprises a glass fabric impregnated with an epoxy resin.

8. The flex-rigid wiring board according to claim 1, wherein the insulative adhesive comprises a prepreg.

9. The flex-rigid wiring board according to claim 8, wherein the prepreg comprises a glass fabric impregnated with an epoxy resin.

10. The flex-rigid wiring board according to claim 1, wherein the portion of the rigid substrate overlapping with the portion of the flexible substrate is in a range between 5% and 40% of a surface area of the rigid substrate.

* * * * *